US009466626B2

United States Patent
Kouyama et al.

(10) Patent No.: US 9,466,626 B2
(45) Date of Patent: Oct. 11, 2016

(54) SOLID-STATE IMAGING APPARATUS

(71) Applicant: Panasonic Corporation, Osaka (JP)

(72) Inventors: Shinzou Kouyama, Osaka (JP); Kazutoshi Onozawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 147 days.

(21) Appl. No.: 14/208,378

(22) Filed: Mar. 13, 2014

(65) Prior Publication Data

US 2014/0191356 A1 Jul. 10, 2014

Related U.S. Application Data

(63) Continuation of application No. PCT/JP2012/000359, filed on Jan. 20, 2012.

(30) Foreign Application Priority Data

Sep. 20, 2011 (JP) .................. 2011-204265

(51) Int. Cl.
*H01L 27/146* (2006.01)
*G03B 35/08* (2006.01)
*H04N 5/369* (2011.01)
*H04N 13/02* (2006.01)

(52) U.S. Cl.
CPC ......... *H01L 27/14605* (2013.01); *G03B 35/08* (2013.01); *H01L 27/14627* (2013.01); *H01L 27/14629* (2013.01); *H04N 5/369* (2013.01); *H04N 13/0217* (2013.01); *H04N 13/0228* (2013.01); *H04N 13/0232* (2013.01)

(58) Field of Classification Search
CPC combination set(s) only.
See application file for complete search history.

(56) References Cited

U.S. PATENT DOCUMENTS

| 5,743,846 A | 4/1998 | Takahashi et al. |
| 6,306,082 B1 | 10/2001 | Takahashi et al. |
| 6,976,956 B2 | 12/2005 | Takahashi et al. |

(Continued)

FOREIGN PATENT DOCUMENTS

| JP | 7-261099 | 10/1995 |
| JP | 2003-5096 | 1/2003 |

(Continued)

OTHER PUBLICATIONS

International Search Report issued Apr. 24, 2012 in corresponding International Application No. PCT/JP2012/000359.

*Primary Examiner* — Mohammad Islam
*Assistant Examiner* — Ratisha Mehta
(74) *Attorney, Agent, or Firm* — Wenderoth, Lind & Ponack, L.L.P.

(57) ABSTRACT

A solid-state imaging apparatus is disclosed in which, in a first unit cell, light is collected to maximize an amount of light received when the light is incident at a first angle-of-incidence, and in a second unit cell adjacent to the first unit cell, light is collected to maximize an amount of light received when the light is incident at a second angle-of-incidence, the amount of light received when the light is incident at a third angle-of-incidence on the first unit cell is equal to the amount of light received when the light is incident at the third angle-of-incidence on the second unit cell, the first angle-of-incidence is greater than the third angle-of-incidence by a predetermined amount, and the second angle-of-incidence is smaller than the third angle-of-incidence by the predetermined amount.

19 Claims, 19 Drawing Sheets

(56) References Cited

U.S. PATENT DOCUMENTS

| | | |
|---|---|---|
| 8,018,508 B2 | 9/2011 | Toshikiyo |
| 2002/0082476 A1 | 6/2002 | Takahashi et al. |
| 2006/0066922 A1* | 3/2006 | Nishi ............... H01L 27/14625 358/482 |
| 2007/0146531 A1 | 6/2007 | Toshikiyo |
| 2008/0011937 A1* | 1/2008 | Toshikiyo ......... H01L 27/14625 250/208.1 |
| 2011/0019050 A1* | 1/2011 | Yamashita .......... H01L 27/1463 348/308 |

FOREIGN PATENT DOCUMENTS

| | | |
|---|---|---|
| JP | 2003-7994 | 1/2003 |
| JP | 2005-455 | 1/2005 |
| JP | 2006-165601 | 6/2006 |
| JP | 2007-279512 | 10/2007 |
| JP | 2007-317951 | 12/2007 |
| WO | 2005/101067 | 10/2005 |

* cited by examiner

201: Corresponding to right-eye
202: Corresponding to left-eye

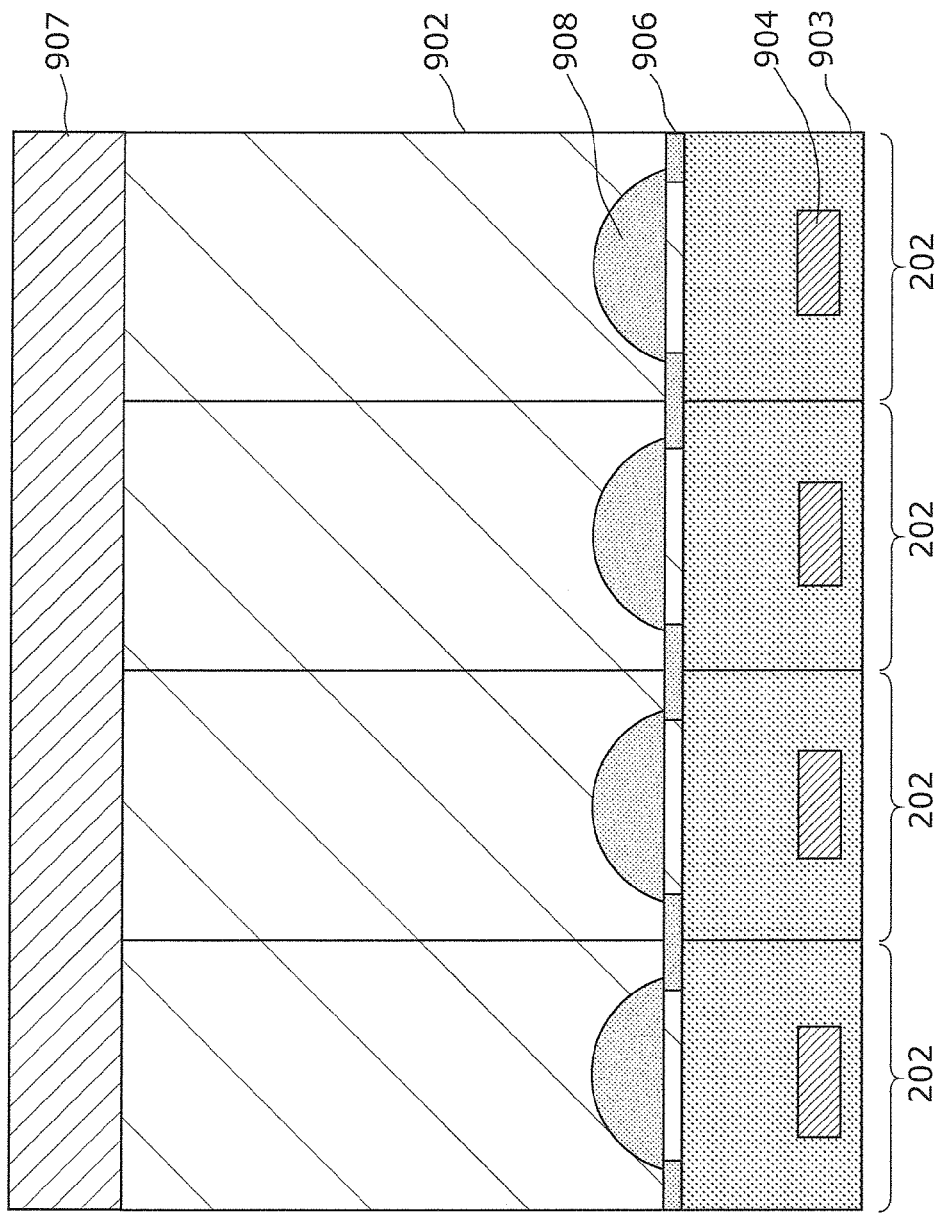

SOLID-STATE IMAGING APPARATUS

CROSS REFERENCE TO RELATED APPLICATIONS

This is a continuation application of PCT International Application No. PCT/JP2012/000359 filed on Jan. 20, 2012, designating the United States of America, which is based on and claims priority of Japanese Patent Application No. 2011-204265 filed on Sep. 20, 2011. The entire disclosures of the above-identified applications, including the specifications, drawings and claims are incorporated herein by reference in their entirety.

FIELD

The present disclosure relates to solid-state imaging apparatuses, and particularly relates to a technique for controlling incident light collected by a light-collecting element to different exit pupil positions, that is a technique for a lens of a unit cell of a solid-state imaging apparatus which allows stereoscopic viewing.

BACKGROUND

The conventional solid-state imaging apparatuses which allow stereoscopic viewing have difficulties in receiving the light incident from two directions different from each other simultaneously and efficiently.

For example, Patent Literature (PTL) 1 discloses a method for changing an angle of incidence of light to be incident on the solid-state imaging apparatus by time division, using a time-division optical path switching means capable of switching two optical paths by time division. This makes it possible to receive the incident light from two different angles, which allows stereoscopic viewing at two viewpoints.

Furthermore, PTL 2 discloses a solid-state imaging apparatus in which inclined surfaces opposed to each other formed on the surface of a single element are provided with a plurality of pixels at predetermined intervals so as to serve as light receiving surfaces on which the object light with different angles of incidence is incident. In this way, it is possible to simultaneously receive the incident light having angle of incidence of two types.

Furthermore, PTL 3 discloses a technique for imaging, on the surface of a single element, right and left parallax images side by side. This makes it possible to simultaneously image images of two viewpoints by a single solid-state imaging apparatus.

CITATION LIST

Patent Literature

[PTL 1] Japanese Unexamined Patent Application Publication No. 07-261099
[PTL 2] Japanese Unexamined Patent Application Publication No. 2005-000455
[PTL 3] Japanese Unexamined Patent Application Publication No. 2003-005096

SUMMARY

Technical Problem

However, the technique in PTL 1 has an intrinsic issue that images of different viewpoints are developed in the time axis. Specifically, positional relationship between the two images of two viewpoints developed in the time axis direction has to be kept as it is set at least in the horizontal and vertical directions. This requires the imaging apparatus to remain stationary surely while being used, which limits the application of the technique. In the case where the subject is a moving object, it becomes difficult to allow stereoscopic viewing.

On the other hand, with the technique in PTL 2, the images of different viewpoints can be obtained simultaneously, which does not require the imaging apparatus to remain stationary. However, in the technique in PTL 2, it is required to form a stereoscopic structure on a surface of the semiconductor substrate, which requires a special step for processing concavo-convex on the surface of the semiconductor substrate. Besides, since it is required to form the light receiving unit perpendicular to the inclined surface, it is required to perform impurity implantation process from a considerably special angle and more than once. This is difficult in the fabricating process, and the costs are increased.

Furthermore, in the method in PTL 3, a light-blocking plate having two openings is required to prevent an image from two viewpoints from being incident on a single pixel.

The present disclosure has been conceived in view of solving the above issues, and has a primary object to provide a solid-state imaging apparatus which can receive the incident light from two directions simultaneously and can be fabricated by a standard semiconductor processing.

Furthermore, the present disclosure has a secondary object to provide a solid-state imaging apparatus which allows stereoscopic viewing without requiring the light-blocking plate having two openings.

Solution to Problem

In order to achieve the above object, a solid-state imaging apparatus according to an aspect of the present disclosure includes an imaging region; and a plurality of unit cells arranged two-dimensionally in the imaging region, the plurality of unit cells including a first unit cell and a second unit cell, wherein each of the plurality of unit cells has a light-receiving element and a light-collecting element, the first unit cell includes a first light-receiving element and a first light-collecting element, the first light-collecting element collects a first incident light to maximize an amount of a first light incident on the first light-receiving element when the first incident light is incident at a first angle-of-incidence, the second unit cell adjacent to the first unit cell includes a second light-receiving element and a second light-collecting element, the second light-collecting element collects a second incident light to maximize an amount of a second light incident on the second light-receiving element when the second incident light is incident at a second angle-of-incidence, an amount of the first light incident on the first light-receiving element when the first incident light is incident at a third angle-of-incidence on the first unit cell is equal to an amount of the second light incident on the second light-receiving element when the second incident light is incident at the third angle-of-incidence on the second unit cell, the first angle-of-incidence is greater than the third angle-of-incidence by a predetermined amount, and the second angle-of-incidence is smaller than the third angle-of-incidence by the predetermined amount.

Here, a plurality of the first unit cells and a plurality of the second unit cells may be disposed alternately in a column direction and a row direction.

Furthermore, a row including the first unit cell and a row including the second unit cell may be disposed alternately in a column direction.

With the present aspect, the first unit cell and the second unit cell each having a different angle of incidence at which the light amount is maximized are provided adjacent to each other, which allows simultaneously receiving the incident light from two directions. Furthermore, unlike PTL 2, it is not required to form a stereoscopic structure on the semiconductor substrate surface. Thus, a solid-state imaging apparatus can be fabricated with a standard semiconductor process. Furthermore, unlike PTL 3, a solid-state imaging apparatus which allows stereoscopic viewing is realized without a light-blocking plate having two openings.

Furthermore, the unit cells may include a third unit cell adjacent to the first unit cell and a fourth unit cell adjacent to the second unit cell, the third unit cell may include a third light-receiving element and a third light-collecting element, the fourth unit cell may include a fourth light-receiving element and a fourth light-collecting element, the third light-collecting element may collect a third incident light to maximize an amount of a third light incident on the third light-receiving element when the third incident light is incident at the first angle-of-incidence, the fourth light-collecting element may collect a fourth incident light to maximize an amount of a fourth light incident on the fourth light-receiving element when the fourth incident light is incident at the second angle-of-incidence, an amount of the third light incident on the third light-receiving element when the third incident light is incident at the third angle-of-incidence on the third unit cell may be equal to an amount of the second light incident on the second light-receiving element when the second incident light is incident at the third angle-of-incidence on the second unit cell, an amount of the fourth light incident on the fourth light-receiving element when the fourth incident light is incident at the third angle-of-incidence on the fourth unit cell may be equal to an amount of the first light incident on the first light-receiving element when the first incident light is incident at the third angle-of-incidence on the first unit cell, and the imaging region may be divided into a first region and a second region at a boundary between a plurality of the first unit cells and a plurality of the second unit cells, the first region being a first side of the imaging region in which a plurality of the third unit cells are arranged, the second region being a second side of the imaging region in which a plurality of the fourth unit cells are arranged.

With the present aspect, the incident angle at which the light amount is maximized is different for the microlens in the first region and the second region of the imaging region. Therefore, the invalid region of the solid-state imaging apparatus can be reduced and the imaging region can be used efficiently.

Furthermore, the first light-collecting element and the second light-collecting element may be disposed as one unit.

With the present aspect, the light-collecting element having two horizontal pixels as one unit allows the light to be incident on the photoelectric conversion element of one of the two pixels, according to the angle of incidence in the horizontal direction of the incident light to the light-collecting element. Specifically, the light is separated into two types of viewpoints in the horizontal direction, thereby allowing stereoscopic viewing in the right and left. Here, although the horizontal direction is raised as an example to simplify the explanation, the horizontal direction of the imaging device is not necessarily match the horizontal direction of the camera apparatus mounted with the imaging device, and it is also not necessary that the longitudinal direction of the imaging device match the horizontal direction. Specifically, stereoscopic viewing is allowed as long as the light can be classified into two types of incident light having a different angle of incidence. Here, there is no difference in the light-collection ability of the lens in the horizontal direction, even when the lens is in an oval shape, or in a shape in which a circle is cut out. The shape of the lens is selected depending on the sensitivity, design facilitation, and so on.

Furthermore, a plurality of the first light-collecting elements disposed in a same column and a plurality of the second light-collecting elements disposed in a same column may be disposed as one unit.

With the present aspect, the lenses are formed in a row unit, thereby facilitating lens shape control.

Furthermore, each of the unit cells may include an inner-layer light-collecting element disposed below the light-collecting element.

With the present aspect, the inner-layer light-collecting element collects light in the vertical direction, which reduces light collection loss.

Furthermore, the light-collecting element may be divided into line widths substantially a same as or shorter than a wavelength of the incident light, and may have an effective refractive index distribution controlled according to a combination of a plurality of light-transmissive films in a concentric structure about a center axis that is an axis which extends in a direction perpendicular to a light-receiving surface.

With the present aspect, a desired microlens can be fabricated through a standard semiconductor process.

Furthermore, the light-collecting element may have an effective refractive index distribution that is substantially equal to that of a triangular prism.

With the present aspect, a microlens is realized which simultaneously receives incident light having specific angles of incidence different from each other.

Advantageous Effects

With the present disclosure, a solid-state imaging apparatus is realized which is capable of simultaneously receiving the incident light from two directions and can be fabricated by a standard semiconductor process. Furthermore, a solid-state imaging apparatus is realized which allows stereoscopic viewing without requiring a light-blocking plate having two openings.

BRIEF DESCRIPTION OF DRAWINGS

These and other objects, advantages and features of the invention will become apparent from the following description thereof taken in conjunction with the accompanying drawings that illustrate a specific embodiment of the present invention.

FIG. 18 illustrates a sectional view showing an example of a configuration of the microlenses in the unit cell group of the solid-state imaging apparatus according to Embodiment 4.

DESCRIPTION OF EMBODIMENTS

Figure 1:
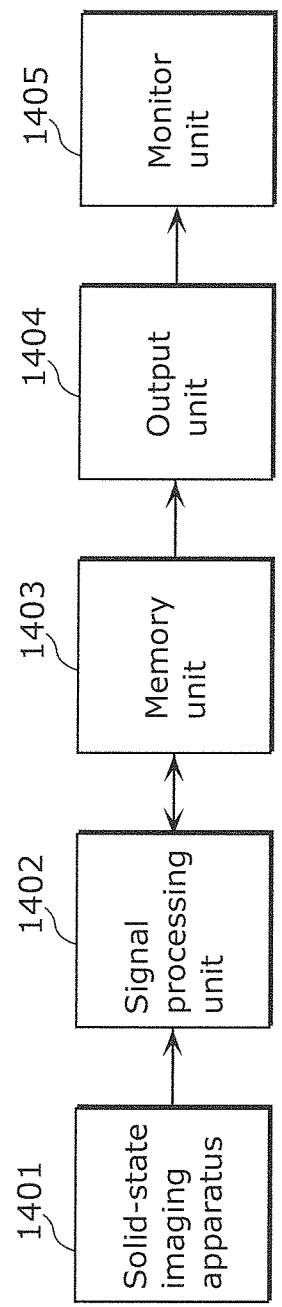
FIG. 1 illustrates a schematic configuration of an imaging apparatus according to Embodiment 1.

The following describes further details of a solid-state imaging apparatus according to the embodiments with reference to the Drawings. It should be noted that the present disclosure is described with reference to the following embodiments and the accompanying Drawings, which are for illustrative purposes only and thus do not limit the present disclosure. The numerical values, shapes, constituent elements, the arrangement and connection of the constituent elements, steps, the processing order of the steps etc, shown in the following embodiments are mere examples, and thus do not limit the present disclosure. The present disclosure is limited only by Claims. Thus, among the constituent elements in the following exemplary embodiments, constituent elements not recited in any of the independent claims indicating the most generic concept of the present disclosure are not always required to achieve the aim of the present disclosure, but are described as preferable constituent elements. Furthermore, in the Drawings, the elements representing substantially the same structure, operation and effect are given the same reference numerals.

Embodiment 1

FIG. 1 illustrates a schematic configuration of an imaging apparatus (camera) according to Embodiment 1.

This imaging apparatus includes a solid-state imaging apparatus 1401, a signal processing unit 1402, a memory unit 1403, an output unit 1404, and a monitor unit 1405.

The memory unit 1403 includes a plurality of line memories. Interpolation processing is performed on each of the left-eye image and the right-eye image by combining the data stored in the line memories and signals output from the solid-state imaging apparatus 1401, and data on the processing results is stored in the memory unit 1403. Processed image data stored in the memory unit 1403 is read from the memory unit 1403 and transmitted by the output unit 1404. A transmission format here depends on the existing general 3D image format, and in the case of the side-by-side 3D transmission system for example, the interpolated video signals accumulated in the line memory are output. Furthermore, in another scheme in which the left image and right image are switched per frame, it is sufficient that a frame memory is provided in the memory unit 1403 to output the signal of the solid-state imaging apparatus 1401 at a double speed, or that the interpolated video corresponding to the right eye and the interpolated video corresponding to the left eye are alternately output per frame at an output speed equal to the signal output speed of the solid-state imaging apparatus 1401. It is sufficient to use the generally-known scheme as the above-described interpolation scheme. The interpolation here may be adaptive or non-adaptive.

Figure 2:
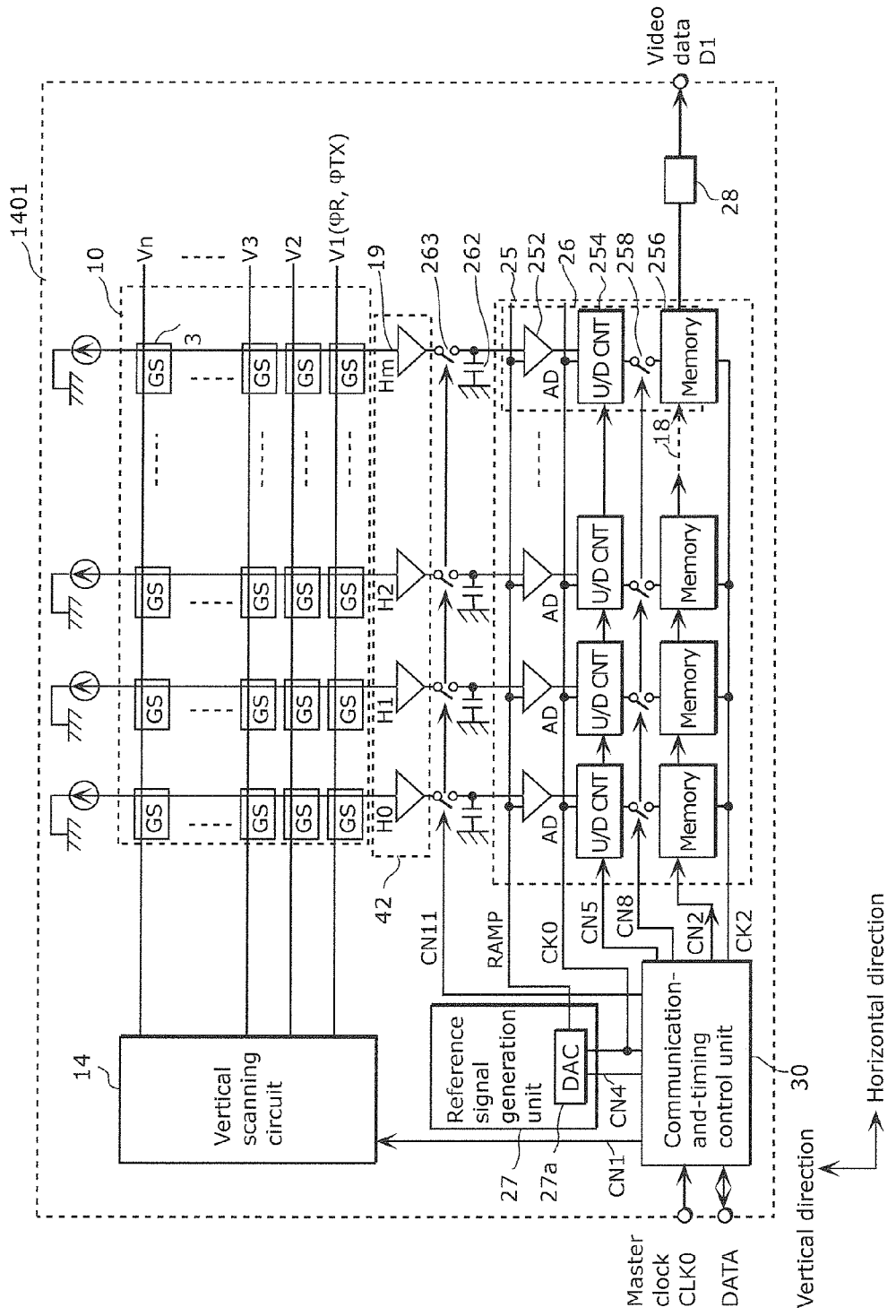
FIG. 2 illustrates a detailed configuration of a solid-state imaging apparatus according to Embodiment 1.

FIG. 2 illustrates a detailed configuration of the solid-state imaging apparatus 1401 according to the present embodiment.

The solid-state imaging apparatus 1401 is a MOS solid-state imaging apparatus, and includes: a pixel unit (pixel array) 10; a vertical scanning circuit (row scanning circuit) 14; a communication-and-timing control unit 30; an analog/digital (AD) conversion circuit 25; a reference signal generation unit 27; an output I/F 28; a signal holding switch 263; a signal holding capacitor 262; and a column amplifier 42.

The pixel unit 10 is an imaging region in which a plurality of unit cells 3 arranged two-dimensionally (in rows and columns) on a well of a semiconductor substrate. Each of the unit cells 3 includes a photoelectric conversion element (pixel) as a light-receiving element, and a light-collecting element (microlens) which collects incident light to the light-receiving element. Each of the unit cells 3 is connected to: a signal line controlled by the vertical scanning circuit 14; and a vertical signal line 19 which transmits a voltage signal from the corresponding unit cell 3 to the AD conversion unit 25.

The vertical scanning circuit 14 scans the unit cells 3 in a vertical direction on a row-by-row basis, and selects a row of unit cells 3 with the vertical signal line 19 from which the voltage signal is output.

The communication-and-timing control unit 30 receives master clock CLK0 and DATA input via an external terminal, generates various internal clock, and controls the reference signal generation unit 27, the vertical scanning circuit 14, and so on.

The reference signal generation unit 27 includes a digital/analog converter (DAC) 27a, which supplies a reference voltage RAMP for AD conversion to a column AD circuit 26 of the AD conversion circuit 25.

The column amplifier 42, the signal holding switch 263, and the signal holding capacitor 262 are provided for each column of the unit pixels 3. The column amplifier 42 amplifies the voltage signal output from the corresponding unit cells 3, and the signal holding capacitor 262 holds the amplified voltage signal transmitted via the signal holding switch 263. Providing the column amplifier 42 allows amplifying the voltage signal of the unit cells 3, thereby improving signal/noise (S/N) and switching gain.

The AD conversion circuit 25 includes a plurality of column AD (column analog digital) circuits 26 each provided for a column of the unit pixels 3. The column AD circuit 26 converts the analog voltage signal of the signal holding capacitor 262 output from the unit pixels 3 into a digital signal, using the reference voltage RAMP generated by the DAC 27a.

The column AD circuit 26 includes a voltage comparison unit 252, a counter unit 254, a switch 258, and a data storage unit 256. The voltage comparison unit 252 compares, with the reference voltage RAMP, the analog voltage signal obtained from the unit pixels 3 via the vertical signal line 19 (H0, H1, . . . Mm) and the signal holding capacitor 262. The data storage unit 256 is configured as a memory which holds: time taken until the voltage comparison unit 252 completes the comparison processing; and the result of counting performed using the counter unit 254.

The voltage comparison unit 252 has one input terminal which receives, together with the input terminals of other voltage comparison units 252, the reference voltage RAMP in stages generated by the DAC 27a. The other input terminal of the voltage comparison unit 252 is connected to the signal holding capacitor 262 of the corresponding one of the columns, and receives the voltage signal from the pixel unit 10. The output signal of the voltage comparison unit 252 is supplied to the counter unit 254.

The column AD circuit 26 starts counting using the clock signal at the same time when the reference voltage RAMP is supplied to the voltage comparison unit 252, and performs AD conversion by counting until a pulse signal is obtained, by comparing the analog voltage signal input via the signal holding capacitor 262 with the reference voltage RAMP.

At this time, the column AD circuit 26 performs, together with the AD conversion, processing for taking a differential between (i) the signal level (noise level) of the unit cell 3 immediately after the pixels are reset and (ii) a true signal level Vsig (according to received light amount), on the pixel signal (voltage signal) of a voltage mode input via the signal holding capacitor 262. Accordingly, noise signal components called fixed pattern noise (FPN), reset noise, and the like, can be removed from the voltage signal.

The column AD circuit 26 extracts only the true signal level Vsig by down counting the noise level and up counting the signal level. The signal digitized by the column AD circuit 26 is input to the output I/F 28 via the horizontal signal line 18.

Although the solid-state imaging apparatus 1401 shown in FIG. 2 is provided with the AD conversion circuit 25, the AD conversion circuit 25 may be provided outside the solid-state imaging apparatus.

With the above configuration, in the solid-state imaging apparatus 1401, the pixel unit 10 sequentially outputs the voltage signal from each row of the unit pixels 3. Furthermore, a frame image that is an image of one sheet for the pixel unit 10 is shown by a group of voltage signals of the entire pixel unit 10.

Next, description is provided on a simple optical system of the imaging apparatus, the arrangement of the unit cells 3 in the imaging region (pixel unit 10) of the solid-state imaging apparatus 1401, an outlook of the light-collection distribution function in each region of the imaging region, and a mask layout image.

First, the simple optical system of the imaging apparatus is described in detail.

Figure 3:
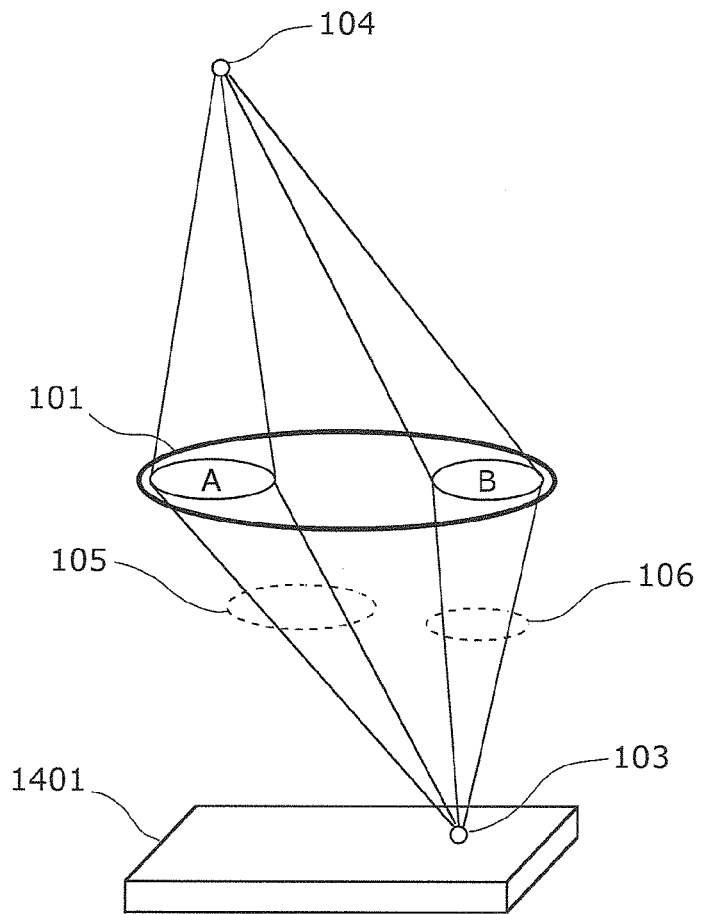
FIG. 3 schematically illustrates an imaging apparatus according to Embodiment 1, in stereoscopic imaging.

FIG. 3 illustrates a schematic diagram of the imaging apparatus in stereoscopic imaging. FIG. 3 illustrates how light is collected to the solid-state imaging apparatus 1401 from two different spots of a single lens (camera lens) 101.

FIG. 3 illustrates a focal point 103 for the case where an image of a subject 104 is formed in the imaging region of the solid-state imaging apparatus 1401 by the lens 101. In the case where the image of the subject 104 is formed by the lens 101, in general, the optical system is established to collect the light which has passed through the entire surface of the lens 101 to the focal point 103. In a general two-dimensional image capturing, out of the waves of light reflected or emitted from the subject 104, a wave which has passed through the lens 101 is collected to the focal point 103. At this time, both the light (light flux) 105 which has passed through the region A in the lens 101 and the light (light flux) 106 which has passed through the region B in the lens 101 are collected to the focal point 103 in the same manner. However, since the subject 104 viewed from the region A and the subject 104 viewed from the region B are originally viewed from different angles, these are different information as the stereoscopic information. Thus, collecting the light which is obtained by collecting the light in the entire surface of the lens 101 to the single focal point 103 is generally realized by integrating the stereoscopic information and converting the integrated stereoscopic information into two-dimensional information. On the other hand, in the imaging apparatus according to the present embodiment, the stereoscopic information which is conventionally integrated to the single focal point is divided and operated, and stored.

Next, arrangement of the unit cells 3 is described in detail.

Figure 4A:
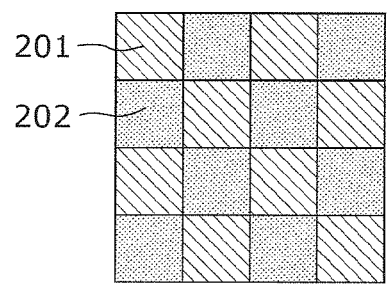
FIG. 4A illustrates an arrangement example of unit cells, which have the maximum sensitivity to different angles of incidence, of the solid-state imaging apparatus according to Embodiment 1.
Figure 4B:
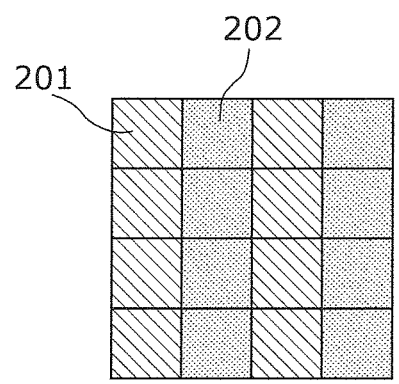
FIG. 4B illustrates an arrangement example of unit cells, which have the maximum sensitivity to different angles of incidence, of the solid-state imaging apparatus according to Embodiment 1.
Figure 4C:
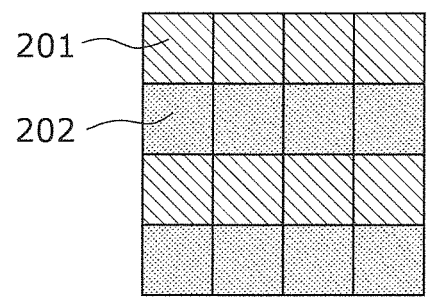
FIG. 4C illustrates an arrangement example of nit cells, which have the maximum sensitivity to different angles of incidence, of the solid-state imaging apparatus according to Embodiment 1.

FIGS. 4A to 4C each illustrates an arrangement example of the unit cell (microlens) for separately storing (collecting) the information (light) which passes through the region A and region B. In FIGS. 4A to 4C, the first unit cell 201 corresponds to the unit cell 3 which receives the light 105 from the region A, and the second unit cell 202 corresponds to the unit cell 3 which receives the light 106 from the region B.

In FIG. 4A, a plurality of the first unit cells 201 and a plurality of the second unit cells 202 are arranged in a hounds tooth check pattern and alternately in the column direction (vertical direction) and the row direction (horizontal direction). In FIG. 4B, a column including the first unit cell 201 and a column including the second unit cell 202 are arranged alternately in the row direction. In FIG. 4C, a row including the first unit cell 201 and a row including the second unit cell 202 are arranged alternately in the column direction. Though arrangement of three types is illustrated as the arrangement of the unit cells, the first unit cells 201 and the second unit cells 202 may be arranged per block which includes a plurality of the first unit cells 201 and a plurality of the second unit cells 202. Such an arrangement locally allows simultaneously receiving the light of two types which is from the region A and the region B.

Next, light-collection distribution function (light-collection property distribution) is described in detail.

Figure 5:
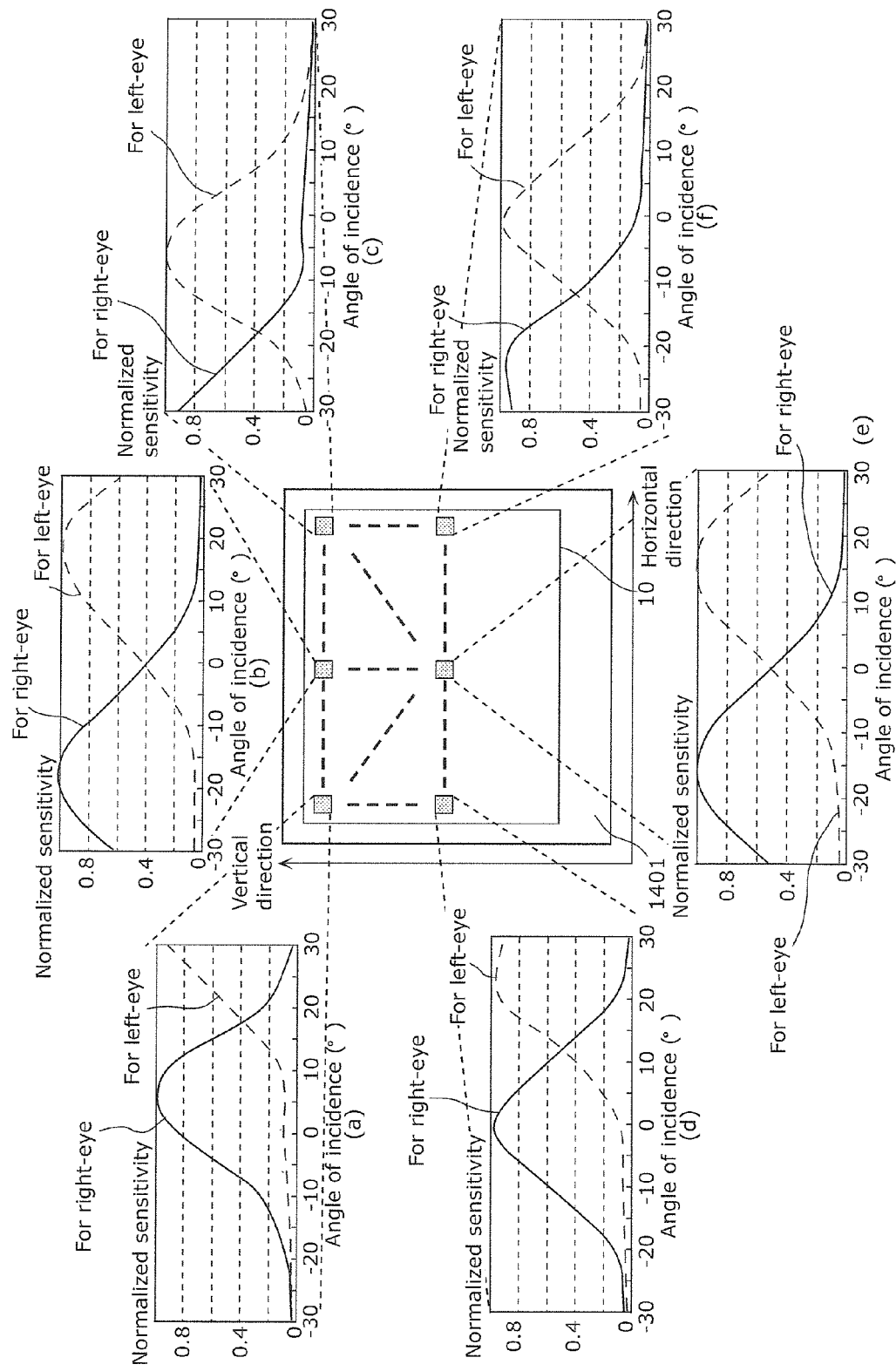
FIG. 5 illustrates light-collection property of microlenses in a pixel unit, per position of the unit cell group, of the solid-state imaging apparatus according to Embodiment 1.

FIG. 5 illustrates light-collection properties of microlenses (light-collecting elements) disposed in the pixel unit 10 of the solid-state imaging apparatus 1401, per position of the unit cell group in the upper side of the pixel unit 10. Specifically, (a) to (f) in FIG. 5 respectively show graphs of light-collection properties of unit cell groups of the pixel unit 10 of the solid-state imaging apparatus 1401: at a left-top corner position (position at the left-edge in the horizontal direction and at the top-edge in the vertical direction); at a top-center position (position in the middle in the horizontal direction and at the top-edge in the vertical direction); at a right-top corner position (position at the right-edge in the horizontal direction and at the top-edge in the vertical direction); at a left-horizontal-end position (position at the left-edge in the horizontal direction and in the middle in the vertical direction); at a center position (position in the middle in the horizontal direction and the vertical direction); and at a right-horizontal-end position (position at the right-edge in the horizontal direction and in the middle in the vertical direction). In FIG. 5, the light-collection properties in the lower side of the pixel unit 10 are the reversed light-collection properties in the upper side of the same. Thus, the light-collection properties in the lower side of the pixel unit 10 are omitted. Each graph of the light-collection property indicates two types of light-collection property including (i) a light-collection property of a microlens of the first unit cell 201 corresponding to the right eye and (ii) a light-collection property of a microlens of the second unit cell 202 corresponding to the left eye, included per unit cell group.

For example, in (d) in FIG. 5, the light-collection property of the microlens of the first unit cell 201 corresponding to the right eye is a light-collection property centered at the incident light of substantially 0 degrees, while the light-collection property of the microlens of the second unit cell 202 corresponding to the left eye is a light-collection property centered at the incident light of 20 degrees. Arranging the microlenses having the two types of light-collection property per unit cell group makes it possible to realize a single-board solid-state imaging apparatus which separately receives the light passes through the region A and the light passes through the region B in FIG. 3.

It is understood from FIG. 5 that: in each of the unit cells of the solid-state imaging apparatus 1401, the microlens collects light to change an amount of the light incident on the light-receiving element according to an angle of incidence of the light incident on the unit cell, in a first unit cell 201 out of the unit cells, the microlens collects light to maximize an amount of the light incident on the light-receiving element when the light is incident at a first angle-of-incidence, in a second unit cell 202 adjacent to the first unit cell 201 and out of the unit cells, the microlens collects light to maximize an amount of light incident on the light-receiving element when the light is incident at a second angle-of-incidence, the light incident on the light-receiving element when the light is incident at a third angle-of-incidence on the first unit cell 201 is equal in amount to the light incident on the light-receiving element when the light is incident at the third angle-of-incidence on the second unit cell 202, the first angle-of-incidence is greater than the third angle-of-incidence by a predetermined amount, and the second angle-of-incidence is smaller than the third angle-of-incidence by the predetermined amount. In other words, it is understood that the first unit cell 201 and the second unit cell 202, which are adjacent to each other horizontally or vertically, have optical centers different from each other, and the angle of incidence defined by lines formed of the different optical centers and the first unit cell 201 or the second unit cell 202 is the angle of incidence at which the maximum value of the light amount distribution of the light incident on the light-receiving element is obtained.

Next, description is provided on a microlens which realizes the light-collection distribution function.

Figure 6:
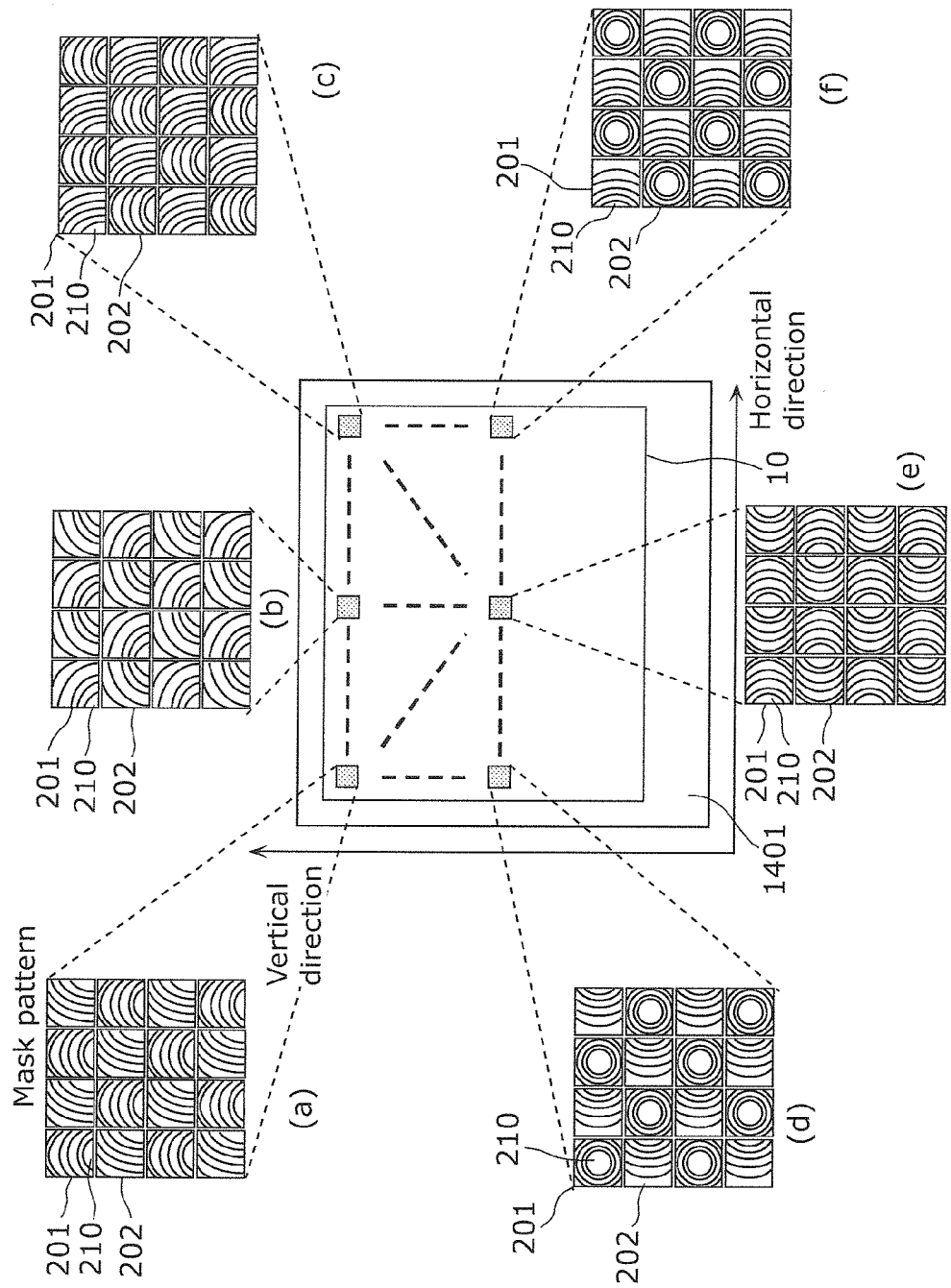
FIG. 6 illustrates an arrangement example of microlenses, per unit cell group, which realizes the light-collection property shown in FIG. 5.

FIG. 6 illustrates an arrangement example of microlenses, per unit cell group, which realizes the light-collection-property distribution shown in FIG. 5. The arrangement example in FIG. 6 illustrates an arrangement example for the case of the unit cells shown in FIG. 4A. (a) to (f) in FIG. 6 shows the top face patterns of the microlenses of the unit cell group (top face pattern of the microlens arranged on each of the 4×4=16 local unit cells) of the pixel unit 10 of the solid-state imaging apparatus 1401: at a left-top corner position; at a top-center position; at a right-top corner position; at a left-horizontal-end position; at a center position; and at a right-horizontal-end position, respectively.

In order to achieve the light-collection property distribution in FIG. 5, when viewed from above, the microlens of each unit cell: is divided into line widths substantially the same as or shorter than the wavelength of the incident light on the microlens; includes a plurality of light-transmissive films 210 in a concentric structure about a center axis that is an axis which extends in a direction perpendicular to a light-receiving surface of the microlens; and has an effective refractive index distribution controlled according to a combination of the light-transmissive films 210.

Furthermore, in order to realize such a microlens, the microlens is a microlens comprising an inorganic material, so-called digital microlens, for example. Implementing the microlens having the top face pattern as shown in FIG. 6 above each unit cell makes it possible to realize the solid-state imaging apparatus 1401 having different light-collection properties to the change of angle of incidence locally in each unit cell.

Figure 7A:
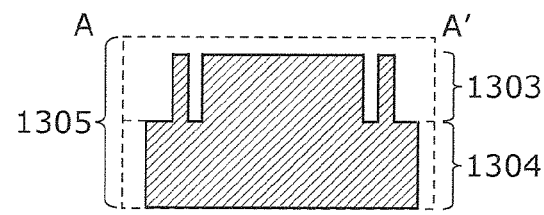
FIG. 7A illustrates a sectional view showing an example of a configuration of the microlenses in the unit cell group of the solid-state imaging apparatus according to Embodiment 1.
Figure 7B:
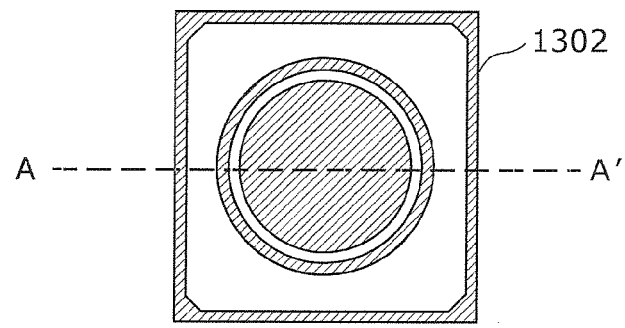
FIG. 7B illustrates a top view of a mask pattern for forming an upper-layer structure of the microlens in FIG. 7A.
Figure 7C:
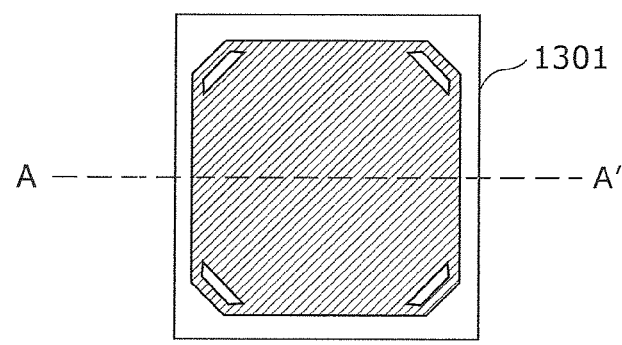
FIG. 7C illustrates a top view of a mask pattern for forming a lower-layer structure of the microlens in FIG. 7A.

FIG. 7A illustrates a sectional view showing an example of a configuration of the microlenses in the unit cell group shown in (d) in FIG. 6 or (f) in FIG. 6, FIG. 7B is a top view of a mask pattern 1301 for forming an upper-layer structure of the microlens in FIG. 7A, and FIG. 7C is a top view of a mask pattern 1302 for forming a lower-layer structure of the microlens in FIG. 7A.

The microlens 1305 shown in FIG. 7A is a two-layer microlens formed using the mask pattern in FIG. 7B and FIG. 7C. The microlens 1305 includes: a lower-layer light-collecting unit 1304 formed with the mask pattern 1301 for the lower layer; and an upper-layer light-collecting unit 1303 formed with the mask pattern 1302 for the upper layer.

Figure 8:
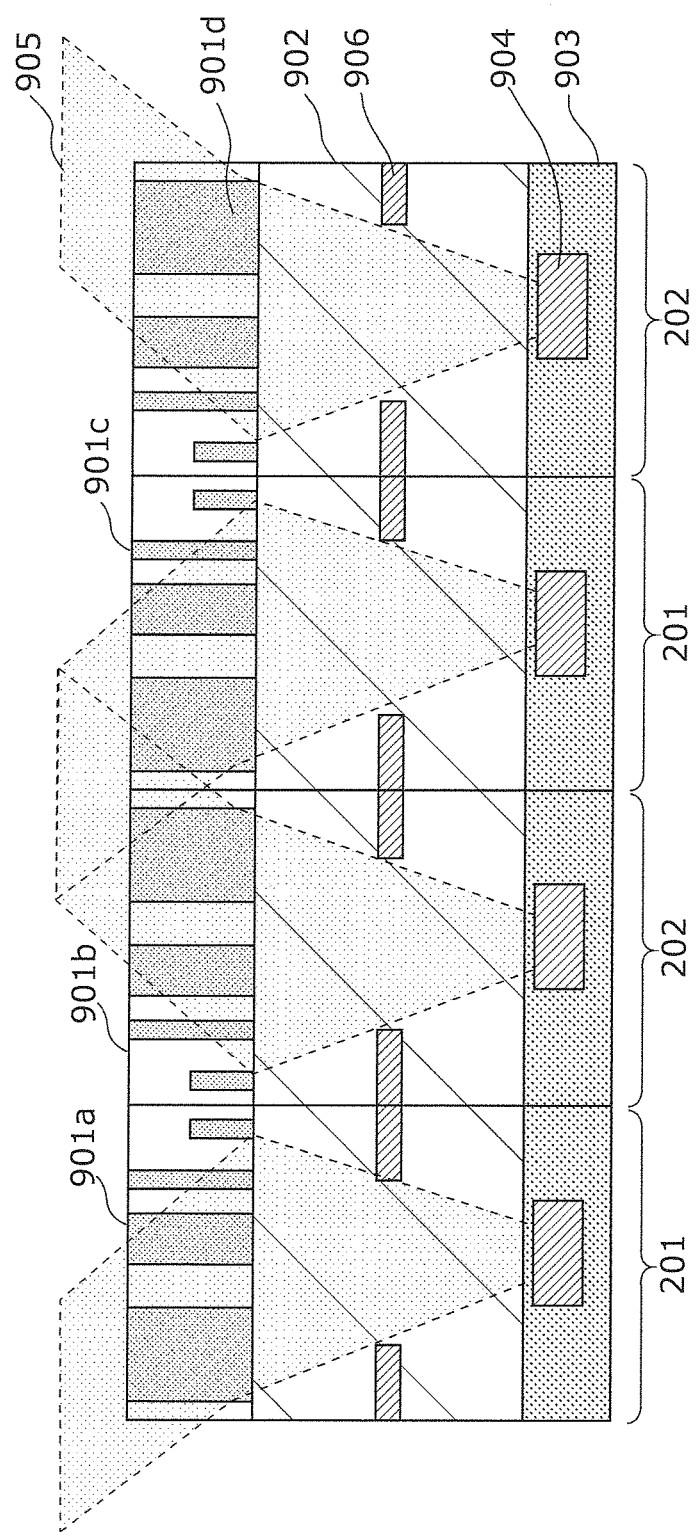
FIG. 8 illustrates a sectional view showing another example of a configuration of the microlenses in the unit cell group of the solid-state imaging apparatus according to Embodiment 1.

FIG. 8 illustrates a sectional view showing another example of a configuration of the microlens of the pixel unit 10 in FIG. 6. FIG. 8 illustrates a sectional view (sectional view obtained when cutting in the horizontal direction) showing configurations of four characteristic unit cells and configurations of microlenses at the center position ((e) in FIG. 6) of the pixel unit 10 of the solid-state imaging apparatus 1401.

In FIG. 8, microlenses 901a and 901c collect the light incident obliquely from the left side to the light-receiving element (photoelectric conversion element) 904 in a semiconductor substrate 903, while microlenses 901b and 901d collect the light incident obliquely from the right side to the light-receiving element 904. The light to the unit cells is incident obliquely from the right side or the left side. The light collected at each of the microlenses 901a, 901b, 901c, and 901d passes through an opening of a light-shielding film 906 and is incident on the light receiving element 904.

It is to be noted that the above-described microlens 1305 in FIG. 7A can produce the same advantageous effect as in FIG. 8, since the two-layer light-collecting unit forms the two two-layer microlenses having different refractive index distributions on the imaging region surface and are in contact with each other at the boundary.

Although the distribution refractive index microlens is used as the light-collecting element in the present embodiment, a pixel prism having a function only to bend the light but not to collect the light, that is a light-collecting element having an effective refractive index distribution that is substantially equal to that of a triangular prism, may be used as another light-collecting element.

As described above, with the solid-state imaging apparatus according to the present embodiment, the first unit cell and the second unit cell each having different angle of incidence at which the light amount is maximized are provided adjacent to each other, thereby receiving the incident light from two directions simultaneously. Furthermore, unlike PTL 2, it is not required to form a stereoscopic structure on the semiconductor substrate surface. Thus, a solid-state imaging apparatus can be fabricated with a standard semiconductor process. Furthermore, unlike PTL 3, a solid-state imaging apparatus which allows stereoscopic viewing is realized without a light-blocking plate having two openings.

Embodiment 2

Hereinafter, an imaging apparatus according to Embodiment 2 is described.

The imaging apparatus in the present embodiment is different from the imaging apparatus in Embodiment 1 in that the pixel unit is divided into two in the horizontal direction.

First, a simple optical system of the imaging apparatus is described in detail.

Figure 9:
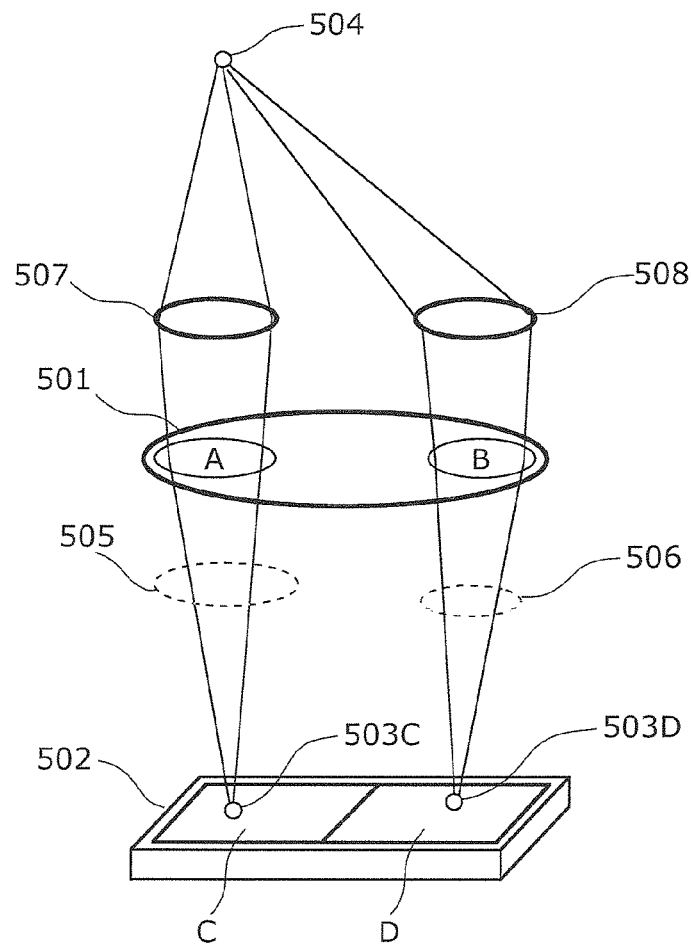
FIG. 9 schematically illustrates an imaging apparatus according to Embodiment 2, in stereoscopic imaging.

FIG. 9 illustrates a schematic diagram of the imaging apparatus in stereoscopic imaging. FIG. 9 illustrates how the light collected at two lenses 507 and 508 goes through a single lens 501 and is collected to different focal points 503C and 503D.

FIG. 9 illustrates the focal points 503C and 503D for the case where images of a subject 504 are formed by the lens 501 in the imaging region of the solid-state imaging apparatus 502. In the case where the image of the subject 504 is formed at two viewpoints, namely at the lens 507 and lens 508, and the image of the light which has passed through each of the lens 507 and the lens 508 is formed at the lens 501, the image of the light which has passed the lens 507 passes through the region A of the lens 501, the image of the light which has passed the lens 508 passes through the region B of the lens 501, and the images are formed in the imaging region of the solid-state imaging apparatus 502. For example, each of the images of the subject 504 is formed on the focal point 503C in the region C and the focal point 503D in the region D, of the imaging region of the solid-state imaging apparatus 502. As described above, the solid-state imaging apparatus 502 receives the light which has passed each of the two lenses 507 and 508 separately in the region C and region D. Here, FIG. 9 does not limit the lenses 507 and 508 to general lens systems each formed of a single convex lens. It is intended that the lenses are lens systems having arbitrary lens structure which guides the light to the lens 501. Separately collecting the light from each of the two optical systems to the region C and region D requires, in general, providing an invalid region between the region C and region D. It is necessary to provide, in the solid-state imaging apparatus 502, a region for causing the light from the two optical systems to be mixed or not to be mixed. However, with the present embodiment, this region can be removed.

Next, arrangement of the unit cell is described in detail.

Figure 10:
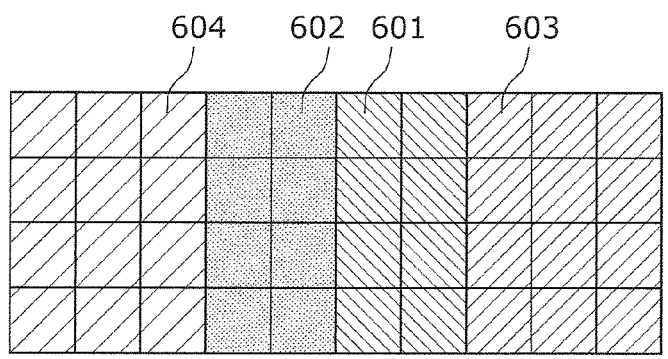
FIG. 10 illustrates an arrangement example of unit cells, which have the maximum sensitivity to different angles of incidence, of the solid-state imaging apparatus according to Embodiment 2.

FIG. 10 illustrates an arrangement example of the unit cells (microlenses) for separately storing (collecting) the information (light) which passes through each of the region A and region B (arrangement example of the unit cell at the boundary between the region C and region D). In FIG. 10, a first unit cell 602 and a third unit cell 603 correspond to the unit cells which receive light (light flux) 505 from the region A, and a second unit cell 601 and a fourth unit cell 604 correspond to the unit cells which receive light (light flux) 506 from the region B. Particularly, the first unit cell 602 and the second unit cell 601 correspond to the unit cells 3 forming the boundary between the region C and region D. Furthermore, regarding the unit cells in different regions, in the unit cell which receives the light from one of the optical systems, the microlenses which suppress the light incident from the other one of the optical systems are arranged.

A plurality of the third unit cells 603 and a plurality of the fourth unit cells 604 are arranged opposed to each other with sandwiching the first unit cells 602 and the second unit cells 601 therebetween.

Next, light-collection distribution function is described in detail.

Figure 11:
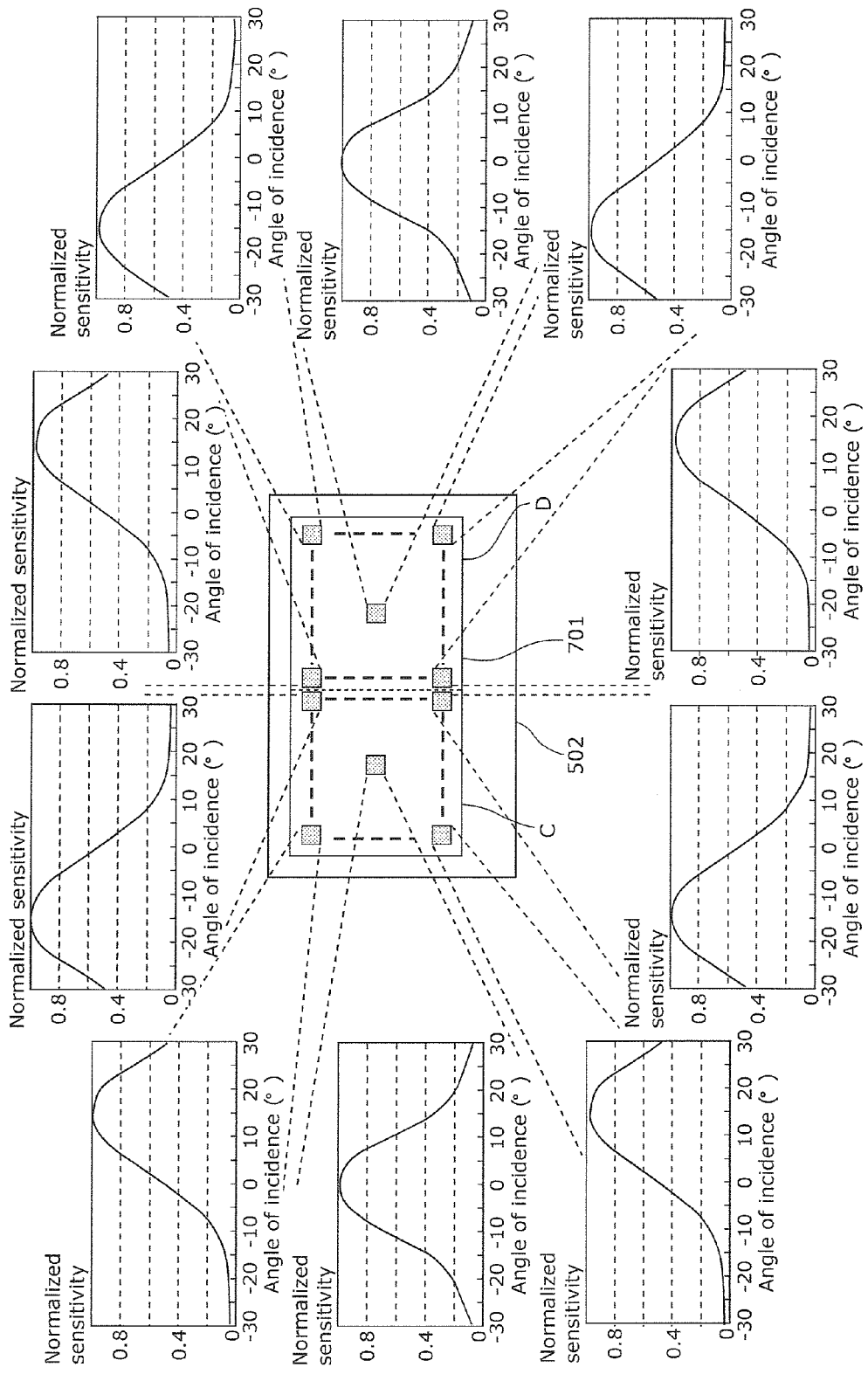
FIG. 11 illustrates light-collection property of microlenses in a pixel unit, per position of the unit cell group, of the solid-state imaging apparatus according to Embodiment 2.

FIG. 11 illustrates light-collection properties of microlenses disposed in a pixel unit 701 of the solid-state imaging apparatus 502, per position of the unit cell group in the pixel unit 701.

The solid-state imaging apparatus 502 includes the pixel unit 701 including the region C and region D each receives the light from corresponding one of the two optical systems.

FIG. 11 illustrates the case where the optical centers of the two optical systems are set to the region C and region D, respectively. In this case, the light-collection properties around the respective centers of the region C and the region D are symmetric with respect to 0 degrees. In contrast, regarding light-collection properties around the boundary between the region C and region D, the curves indicating the light-collection properties are symmetric to each other with respect to 0 degrees of angle of incidence, in the case where the comparison is performed on the light-collection property of the first unit cell 602 in the region C and the light-collection property of the second unit cell 601 in the region D which are adjacent to each other at the border. With such light-collection properties, the light from the non-corresponding optical system can be restricted from being incident, that is, the light from the region B is restricted to be incident on the first unit cell 602 in the region C and the light from the region A is restricted to be incident on the second unit cell 601 in the region D. As a result, the images of two optical systems can be obtained by a single solid-state imaging apparatus without providing the invalid region. Although the optical centers are set at the center of the region C and region D as an example, the optical centers are not necessarily at the center of the region C and region D.

It is understood from FIG. 11 that: in a third unit cell 603 in the region C adjacent to the first unit cell 602 and out of the unit cells of the solid-state imaging apparatus 502, the microlens collects light to maximize an amount of the light incident on the light-receiving element when the light is incident at the first angle-of-incidence, in a fourth unit cell 604 in the region D adjacent to the second unit cell 601 and out of the unit cells of the solid-state imaging apparatus 502, the microlens collects light to maximize an amount of the light incident on the light-receiving element when the light is incident at a second angle-of-incidence, the light incident on the light-receiving element when the light is incident at the third angle-of-incidence on the third unit cell 603 is equal in amount to the light incident on the light-receiving element when the light is incident at the third angle-of-incidence on the second unit cell 601, the light incident on the light-receiving element when the light is incident at the third angle-of-incidence on the fourth unit cell 604 is equal in amount to the light incident on the light-receiving element when the light is incident at the third angle-of-incidence on the first unit cell 602, and the pixel unit 701 is divided into a first region and a second region at a boundary between a plurality of the first unit cells 602 and a plurality of the second unit cells 601, the first region being a right side of the pixel unit 701 in which a plurality of the third unit cells 603 are arranged, the second region being a left side of the pixel unit 701 in which a plurality of the fourth unit cells 604 are arranged.

Next, description is provided on a microlens which realizes the light-collection distribution function in FIG. 11.

Figure 12:
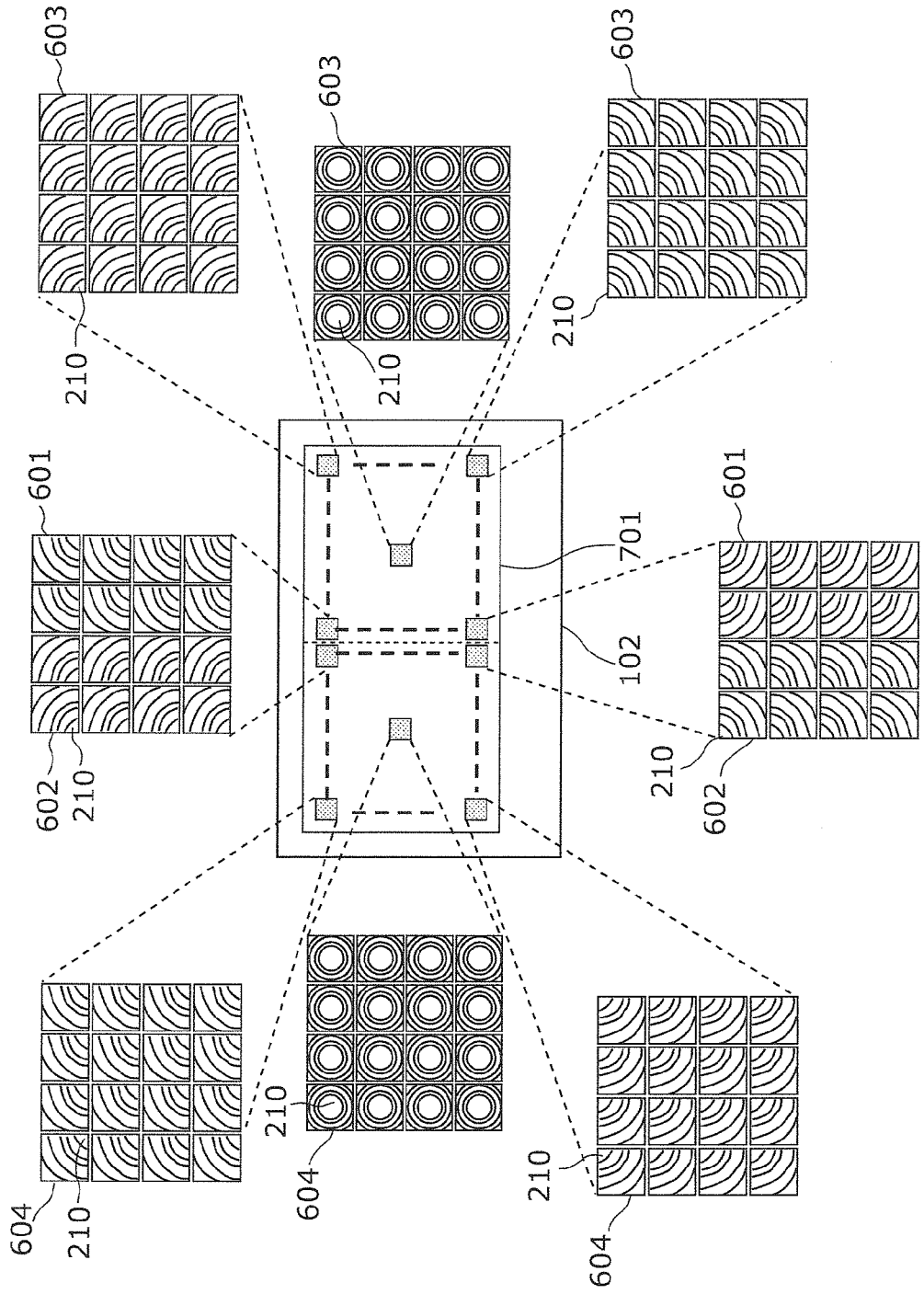
FIG. 12 illustrates an arrangement example of microlenses, per unit cell group, which realizes the light-collection property in FIG. 11.

FIG. 12 illustrates an arrangement example of microlenses which realizes the light-collection property shown in FIG. 11, per unit cell group.

In order to achieve the light-collection property distribution in FIG. 11, in the same manner as in Embodiment 1, the microlens of each unit cell: is divided into line widths substantially the same as or shorter than the wavelength of the incident light on the microlens; includes a plurality of light-transmissive films in a concentric structure about a center axis that is an axis which extends in a direction perpendicular to a light-receiving surface of the microlens; and has an effective refractive index distribution controlled according to a combination of the light-transmissive films 210. Specifically, the microlens has the sectional structure as shown in FIG. 7A described in Embodiment 1, and thus explanation in detail is not provided to avoid overlap.

Arranging the microlenses as shown in FIG. 11 and FIG. 12 makes it possible to realize a single-board solid-state imaging apparatus with no invalid region, even with the double-eyed lens scheme.

As described above, with the solid-state imaging apparatus in the present embodiment, the same advantageous effect as Embodiment 1 can be produced.

Embodiment 3

Hereinafter, the imaging apparatus according to Embodiment 3 is described.

The imaging apparatus in the present embodiment is different from the imaging apparatus in Embodiment 1 in that the imaging apparatus supports four viewpoints.

First, a simple optical system of the imaging apparatus is described in detail.

Figure 13:
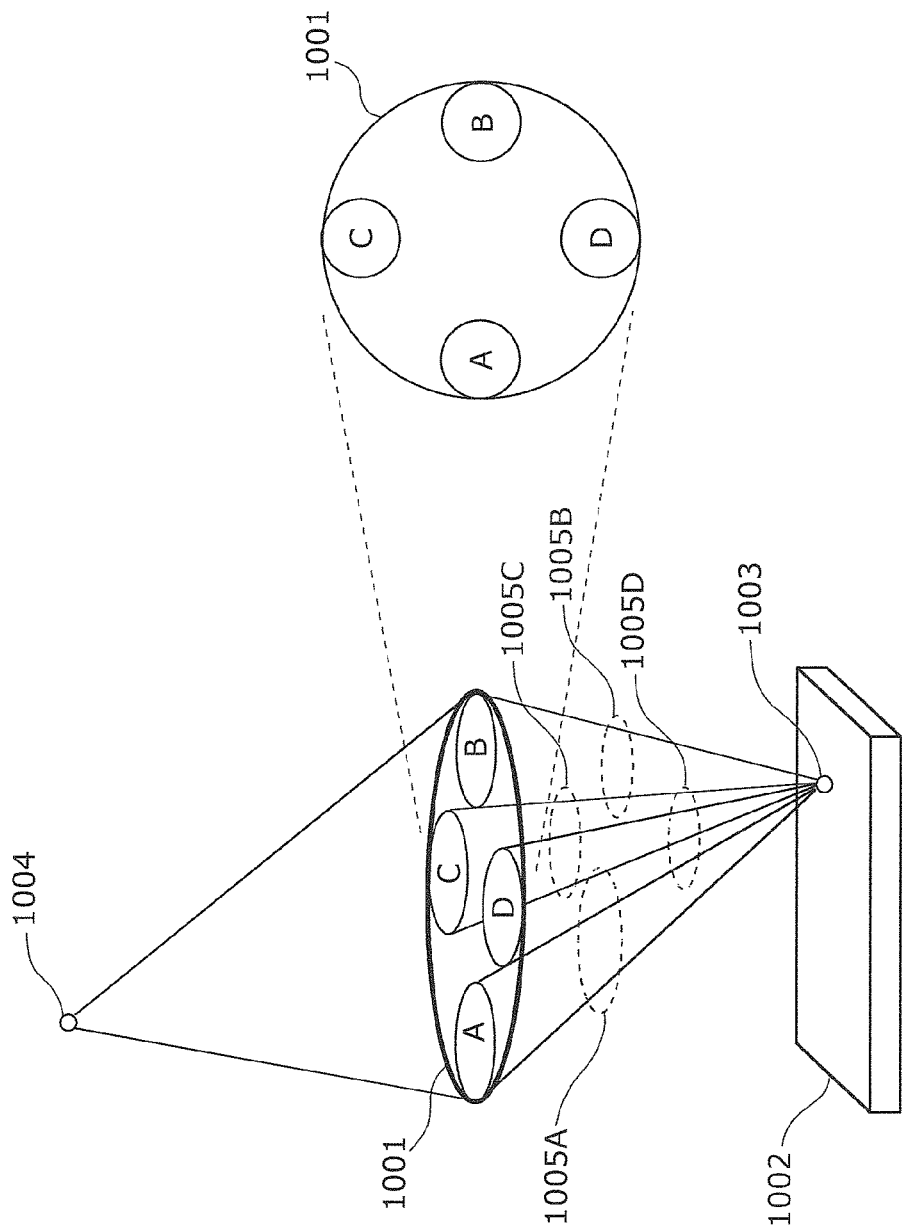
FIG. 13 schematically illustrates an imaging apparatus according to Embodiment 3, in stereoscopic imaging.

FIG. 13 schematically illustrates the imaging apparatus in stereoscopic imaging. FIG. 13 illustrates how the light is collected from four different spots of a lens 1001 to the solid-state imaging apparatus 1002.

FIG. 13 schematically illustrates an optical system which receives the light by a single-board solid-state imaging apparatus with a monocular lens. FIG. 13 illustrates: a lens 1001; a solid-state imaging apparatus 1002; a subject 1004; and light which has passed the lens 1001, particularly light (light flux) 1005A, 1005B, 1005C, and 1005D, which have passed the region A, region B, region C, and region D, of the lens 1001, respectively. The light of the subject 1004 is collected to a focal point 1003 of the solid-state imaging apparatus 1002. Here, although FIG. 13 illustrates as an example a configuration in which the light which has passed each of the four regions in the lens 1001 is collected, that is the four-viewpoint structure, the number of viewpoints is not limited to four as long as it is three or more.

Next, arrangement of the unit cells is described in detail.

Figure 14:
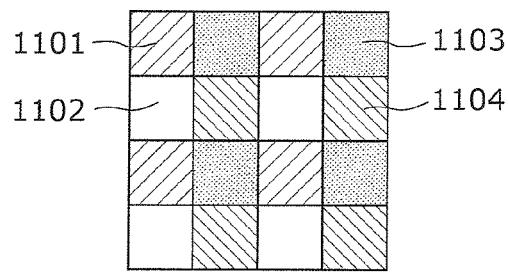
FIG. 14 illustrates an arrangement example of unit cells which have the maximum sensitivity to different angles of incidence, of a solid-state imaging apparatus according to Embodiment 3.

FIG. 14 illustrates an arrangement example of the unit cells (microlenses) for separately storing (collecting) the information (light) which passes through each of the region A, region B, region C, and region D. In FIG. 14, the first unit cell 1101 corresponds to the unit cell 3 which receives the light 1005A from the region A, the second unit cell 1102 corresponds to the unit cell 3 which receives the light 1005B from the region B, the third unit cell 1103 corresponds to the unit cell 3 which receives the light 1005C from the region C, and the fourth unit cell 1104 corresponds to the unit cell 3 which receives the light 1005D from the region D.

The followings are arranged alternately in the row direction: a column in which the first unit cell 1101 and the second unit cell 1102 are arranged alternately in the column direction; and a column in which the third unit cell 1103 and the fourth unit cell 1104 are arranged alternately in the column direction. Specifically, the first unit cell 1101, second unit cell 1102, third unit cell 1103, and fourth unit cell 1104 are set as a single group, and a plurality of the groups are arranged in rows and columns.

Figure 15:
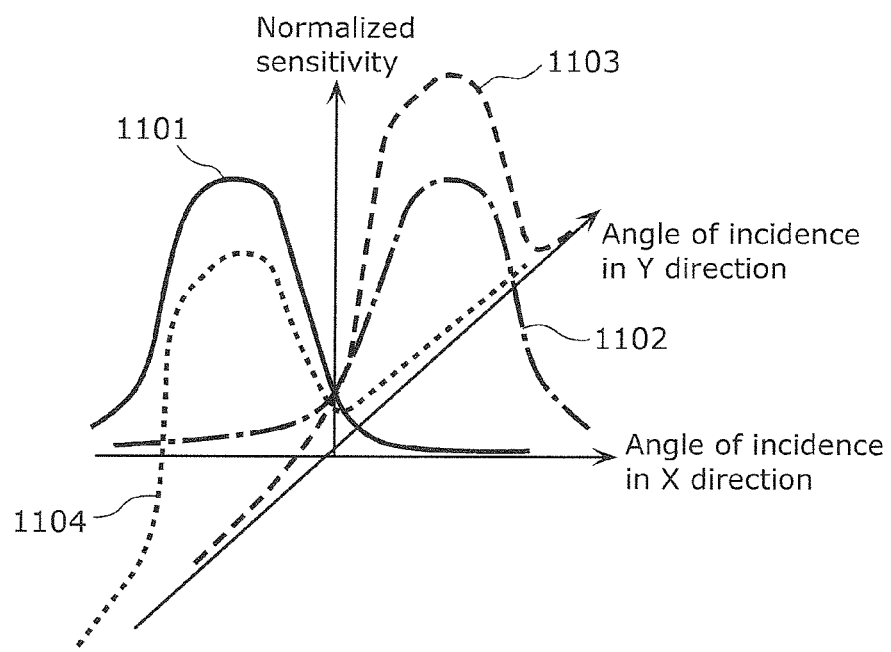
FIG. 15 illustrates a light-collection property of a pixel unit of the solid-state imaging apparatus according to Embodiment 3.

FIG. 15 illustrates light-collection property of the microlens of each of the first unit cell 101, second unit cell 1102, third unit cell 1103, and fourth unit cell 1104, around the center of the pixel unit.

Making the microlenses of the first unit cell 1101, second unit cell 1102, third unit cell 1103, and fourth unit cell 1104 to have the light-collection properties as shown in FIG. 15 allows separately collecting and receiving the light from each of the regions in the right and left and top and bottom of the lens 1001 by different unit cells. Thus, imaging from four viewpoints can be performed simultaneously by a single-board solid-state imaging apparatus. As a result, a multi-view camera having three or more viewpoints can be realized with a single-board solid-state imaging apparatus.

Although not shown in the Drawings, it is also possible to provide an optical system obtained by combining the structure in Embodiment 2 and that in the present embodiment, that is a microlens which has a binocular lens as a front lens and a monocular lens as a rear lens to restrict the light from the optical system not corresponding to the solid-state imaging apparatus. An advantageous effect produced by this structure is that a single-board solid-state imaging apparatus which has no invalid region is realized even in the four-view configuration.

Furthermore, in FIG. 13, the light which passes through each of the four different regions in the lens is separately collected and received by different unit cells. However, the following structures may be combined: a structure of a microlens which separately collects and receives light which passes through each of the two regions, namely the region A and region B in the lens, by different unit cells; and a structure of a conventional microlens which collects and receives light which passes through the entire surface of the monocular lens with no restriction for the angle of incidence. In this case, 3D display is allowed using the output obtained by separately receiving the light from the region A and region B for example, and the conventional sensitive two-dimensional image can also be obtained simultaneously or selectively. For example, it is possible to perform the conventional sensitive two-dimensional imaging in normal use to save the electric power for lighting, and perform 3D imaging when stereoscopic view is needed. Although the sensitivity is lowered in 3D imaging because of the restriction on the angle of incidence of the light, increasing the lighting intensity only for the situation is an option. Aside from the perspective of power, it is said that 3D video causes a higher degree of eye fatigue. Temporal application of 3D video is also an option.

As described above, with the solid-state imaging apparatus in the present embodiment, the same advantageous effect as that of Embodiment 1 is produced.

Embodiment 4

Figure 16:
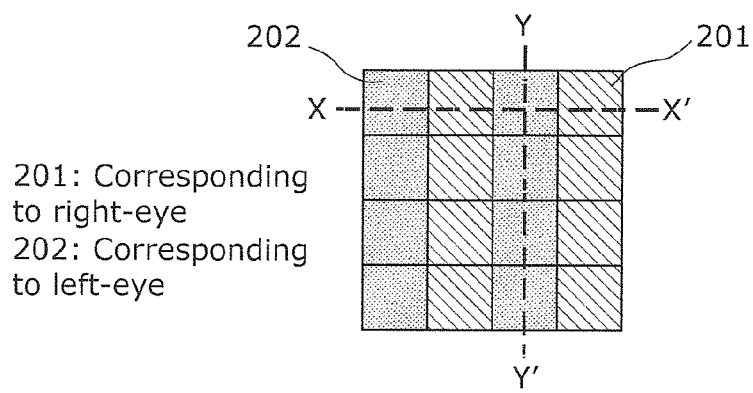
FIG. 16 illustrates an arrangement example of unit cells which have the maximum sensitivity to different angles of incidence, of a solid-state imaging apparatus according to Embodiment 4.

FIG. 16 illustrates a two-dimensional arrangement example of unit cells which separately receives the light which passes through the region A and region B in FIG. 3. In FIG. 16, the first unit cell 201 corresponds to the unit cell 3 which receives the light 105 from the region A, and the second unit cell 202 corresponds to the unit cell 3 which receives the light 106 from the region B.

In FIG. 16, a column including the first unit cell 201 and a column including the second unit cell 202 are arranged alternately in the row direction.

Figure 17A:
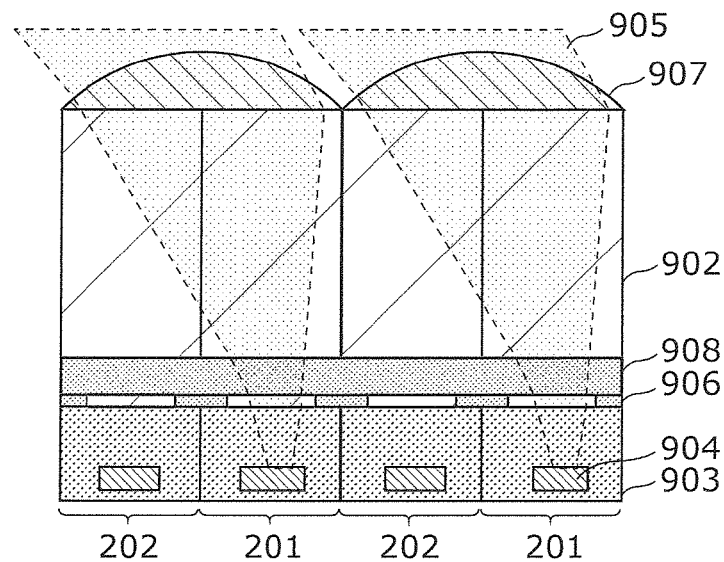
FIG. 17A illustrates a sectional view showing an example of a configuration of a microlens in a unit cell group of the solid-state imaging apparatus according to Embodiment 4.
Figure 17B:
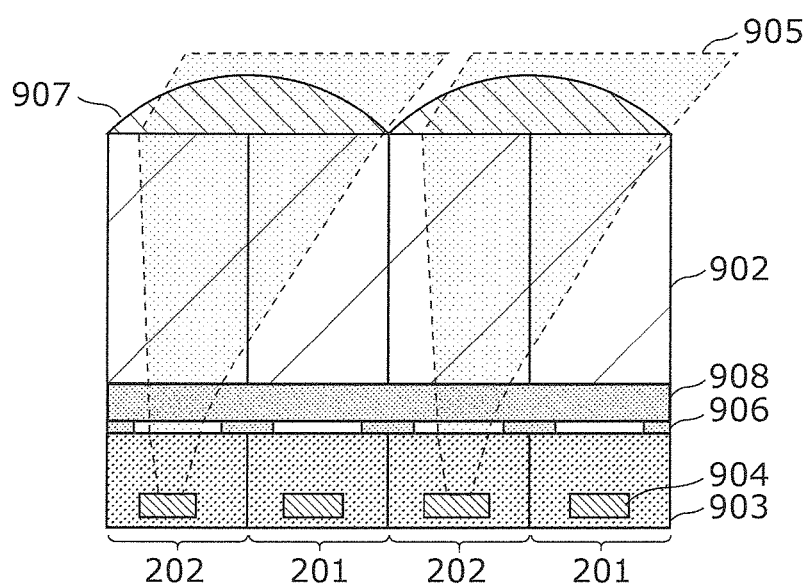
FIG. 17B illustrates a sectional view showing an example of a configuration of the microlenses in the unit cell group of the solid-state imaging apparatus according to Embodiment 4.

Each of FIG. 17A and FIG. 17B illustrates a sectional view (sectional views at X-X' viewed from Y' in FIG. 16) of the first unit cell 201 and the second unit cell 202, and illustrates a structure example of microlenses and how the light is collected. Furthermore, FIG. 18 is a sectional view (sectional view at Y-Y' in FIG. 16) of the second unit cell 202, and illustrates a configuration example of a microlens.

As shown in FIG. 17A, a single microlens 907 is formed across a column including the first unit cell 201 and a column including the second unit cell 202. The microlens 907 collects the light 905 incident obliquely from the region A (left side in FIG. 17A) to the light-receiving element (photoelectric conversion element) 904 in the column including the first unit cell 201. Furthermore, in FIG. 17B, the microlens 907 collects the light incident obliquely from the region B (right side in FIG. 17B) to the light-receiving element 904.

Figure 19:
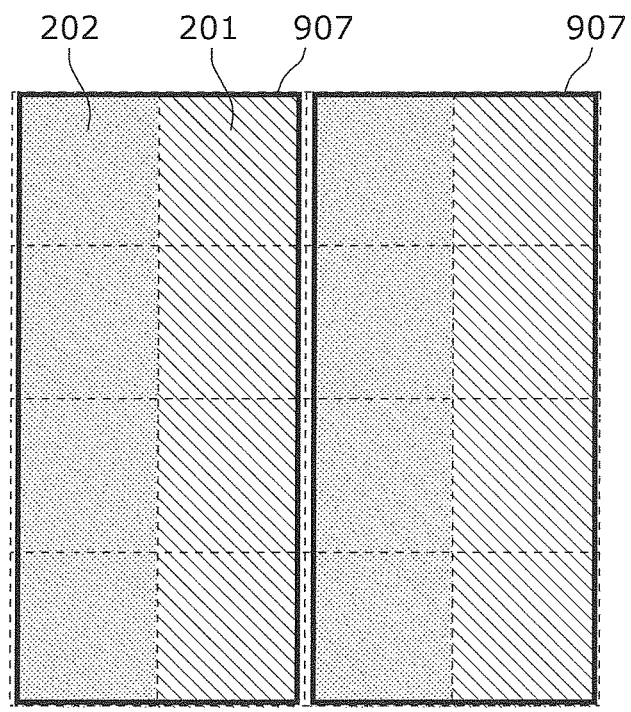
FIG. 19 illustrates a top view showing an example of a configuration of the microlenses in the unit cell group of the solid-state imaging apparatus according to Embodiment 4.

FIG. 19 illustrates a top view of the microlens 907 (plan view on a plane parallel to a surface in which the first unit cell 201 and the second unit cell 202 are arranged two-dimensionally).

A single microlens 907 is arranged across a column including the first unit cell 201 and a column including the second unit cell 202, and has a cylindrical shape in the column direction. Accordingly, the microlens 907 does not have a light-collection property in a vertical direction. Thus, as shown in FIG. 18, the first unit cell 201 and the second unit cell 202 are formed with an inner-layer microlens 908 having a cylindrical shape, per row (across the first unit cell 201 and the second unit cell 202 adjacent in the column direction) and in the row direction. Accordingly, the microlens 907 has: a function to select one of the light from the region A (light from the left in FIG. 17A) and the light from the region B (light from the right in FIG. 17B); and a function to collect the light in the horizontal direction, and the inner-layer microlens 908 which is arranged below the microlens 907 of the unit cell and serves as an inner-layer light-collecting element has a function to collect the light in the vertical direction.

Figure 20:
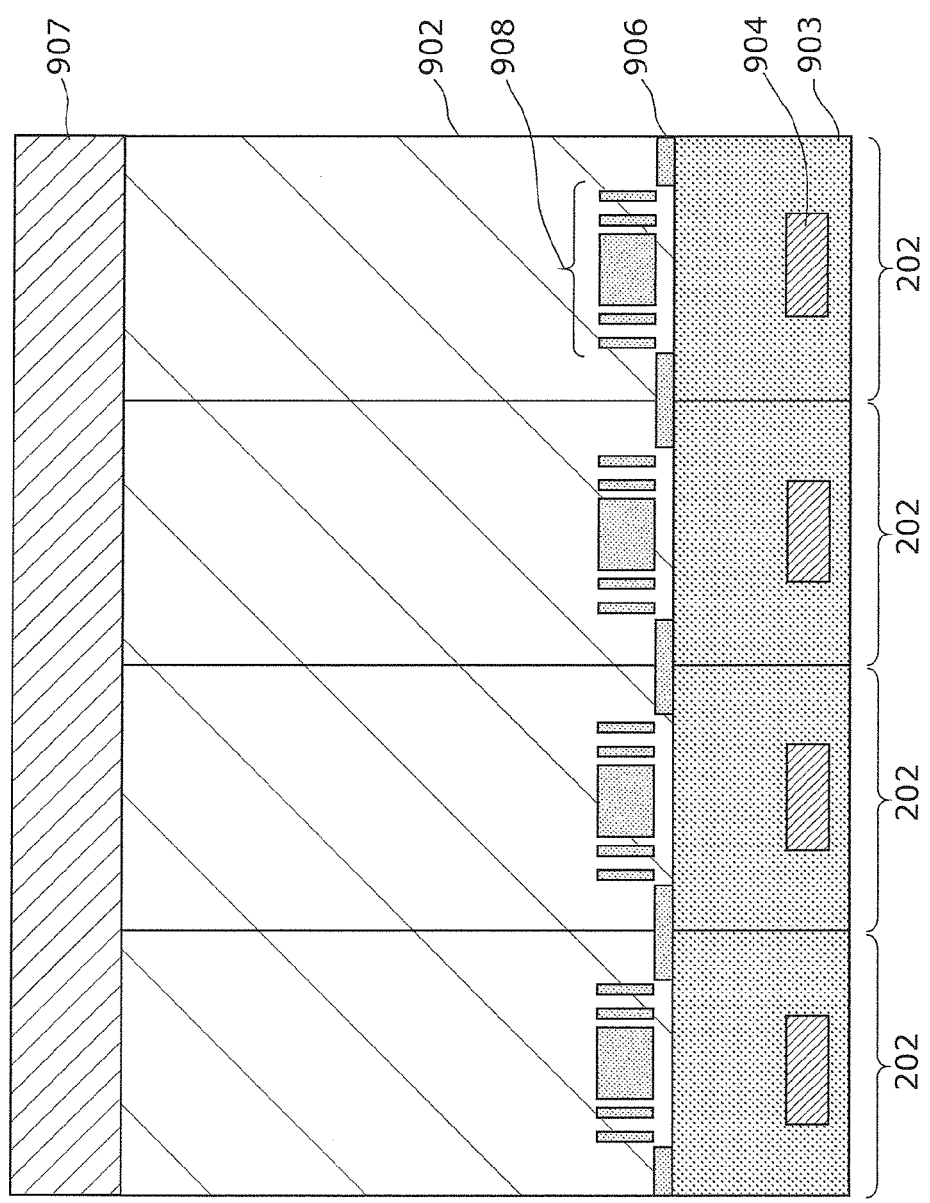
FIG. 20 illustrates a sectional view showing another example of a configuration of the microlenses in the unit cell group of the solid-state imaging apparatus according to Embodiment 4.
Figure 21:
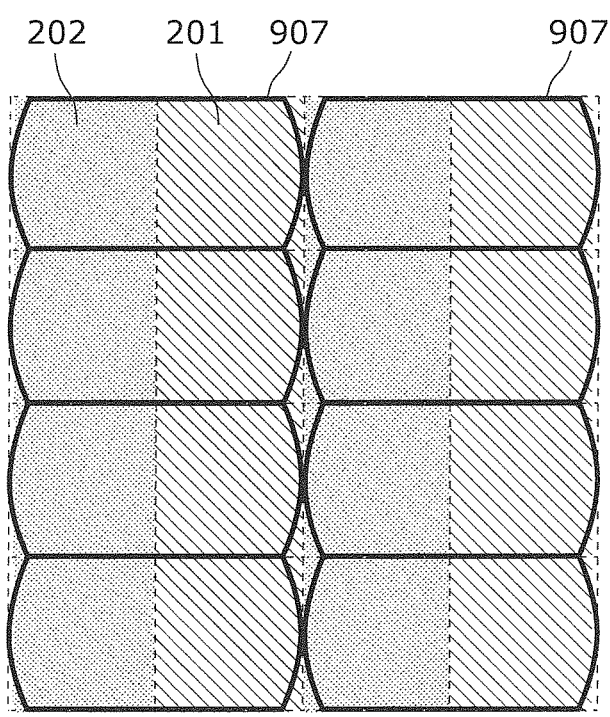
FIG. 21 illustrates a top view showing another example of a configuration of the microlenses in the unit cell group of the solid-state imaging apparatus according to Embodiment 4.

As shown in the sectional view (sectional view at Y-Y' in FIG. 16) of the second unit cell 202 in FIG. 20, the inner-layer microlens 908 may be formed with an effective refractive index lens. The effective refractive index lens is a lens in which a refractive index material having a greater refractive index than the periphery is arranged in a size smaller than or equal to the wavelength of the light, and collects the light at an effective refractive index distribution. The effective refractive index distribution lens allows free designing of the material arrangement. Thus, the lens can be designed on a pixel-by-pixel basis, which leads to an improvement of shading caused by the angle of incidence of the light for example. Furthermore, the microlens 907 may be in a form in which the circular lenses are cut out and arranged in the column direction, as shown in FIG. 21.

Figure 22:
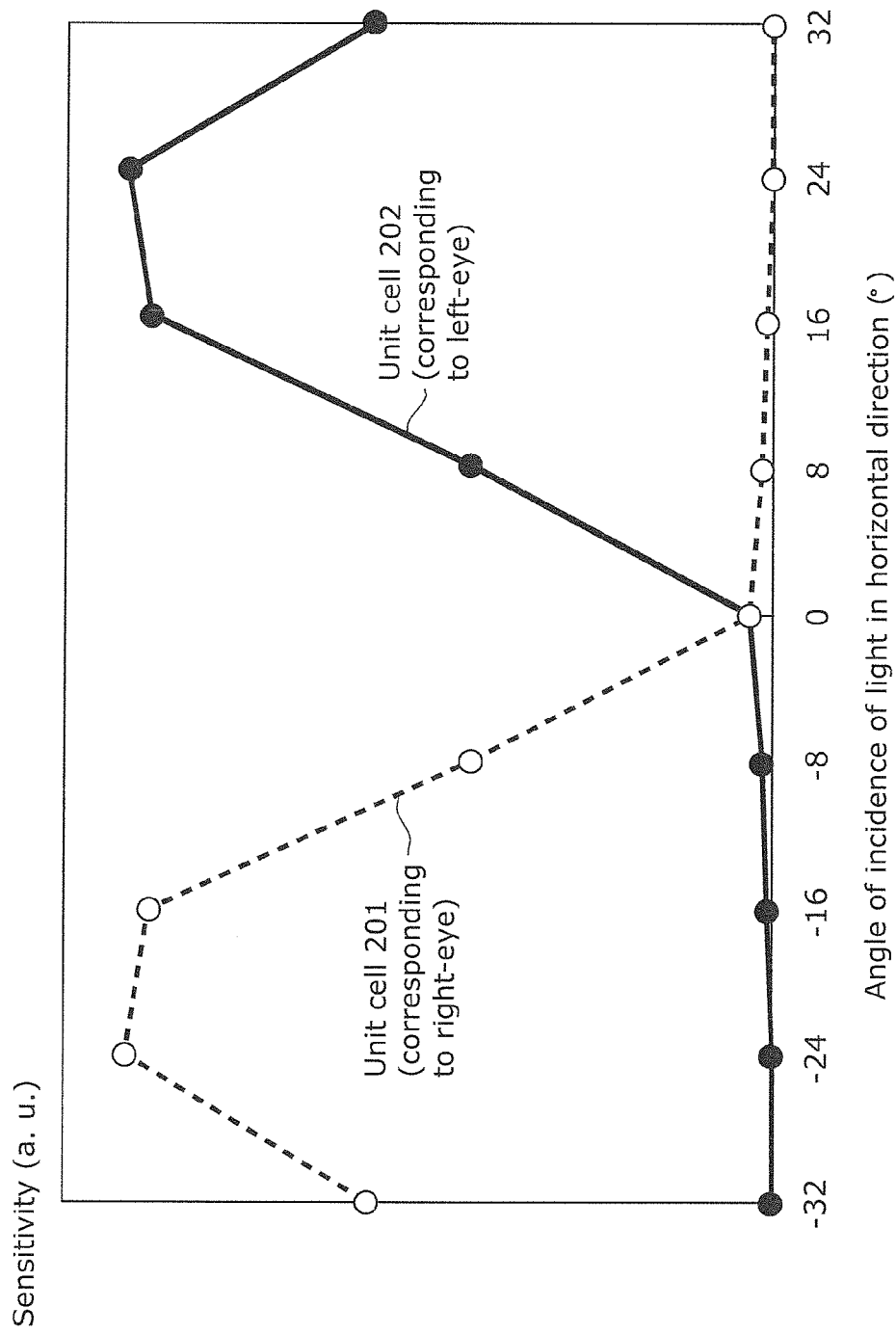
FIG. 22 illustrates light-collection property of a pixel unit of the solid-state imaging apparatus according to Embodiment 4.

FIG. 22 illustrates the light-collection property of the configuration in the present embodiment (X' directions in FIG. 16 is the direction toward the positive angle of incidence). As can be seen from these results, the light can be separated in the horizontal direction by arranging of a plurality of microlenses 907 while taking: the microlens 907 of the first unit cell 201 and the microlens 907 of the second unit cell 202 adjacent to each other as one unit; and the microlens 907 in the column including the first unit cell 201 and the microlens 907 in the column including the second unit cell 202 as one unit.

SUMMARY

As described above with reference to the Drawings, the solid-state imaging apparatus according to the embodiment is a solid-state imaging apparatus in which unit cells including a light-receiving element and a microlens are arranged two-dimensionally. The microlens restricts a range of angle of incidence of the light incident on the light-receiving element, the angles of incidence at the maximum value of light-amount distribution are symmetrical about the angle of incidence at an intersection point of the light-amount distribution, and the angles of incidence at the maximum value are different from each other. The light-amount distribution indicates the angle-of-incidence dependency of the light incident on the light-receiving elements between unit cells adjacent horizontally or vertically.

With this, the microlens restricts a range of angle of incidence of the light incident on the light-receiving element, and between unit cells adjacent horizontally or vertically, the angles of incidence at the maximum value of light-amount distribution are symmetrical about the angle of incidence at an intersection point of the light-amount distribution, and the angles of incidence at the maximum value are different from each other. Thus, it is possible to image the incident light having different angle of incidence simultaneously. Furthermore, since the incident light from different viewpoints can be received simultaneously, it is possible to provide an imaging apparatus which allows stereoscopic viewing in real time.

Here, the microlens of the unit cell may have any implementation structure. Furthermore, more than two types of incident light having different angle of incidence are supported. Specifically, two types of incident light allows stereoscopic viewing on a premise of two different viewpoints in the right and left, and four types of incident light allows stereoscopic viewing on a premise of different viewpoints from the right and left and top and bottom, for example. Here, examples of the stereoscopic viewing may also include oblique directions, in addition to the horizontal direction and the vertical direction. Furthermore, multi-view structure such as N-by-N viewpoints may be adopted (N is an integer greater than or equal to 2). Furthermore, a combination with microlenses which do not restrict the angle of incidence is also possible. As an example of a possible structure, in a four-pixel one-cell in which a single unit cell includes four pixels, one pixel may include a microlens which restricts the angle of incidence of the light for the right eye, another pixel may include a microlens which restricts the angle of incidence of the light for the left eye, and the other two pixels may include microlenses which do not restrict the angle of incidence. In this case, it is possible to obtain two-dimensional video simultaneously with imaging a two-view video for stereoscopic viewing.

Furthermore, the solid-state imaging apparatus is a solid-state imaging apparatus in which unit cells including the light-receiving element and the microlens are arranged two-dimensionally and a main range of the angle of incidence of the light allowed to be incident on is different for the microlenses in the right and left of the imaging region. Since the main range of the angle of incidence of the light allowed to be incident on is different for the microlenses in the right and left of the imaging region, it is possible to reduce the invalid region of the solid-state imaging apparatus and to use the imaging region efficiently.

Furthermore, the microlens is divided into line widths substantially the same as or shorter than the wavelength of the incident light; and has an effective refractive index distribution controlled according to a combination of the light-transmissive films in a concentric structure about a center axis that is an axis which extends in a direction perpendicular to a light-receiving surface of the microlens. With this, a desirable microlens for the solid-state imaging apparatus can be fabricated with a standard semiconductor process.

Furthermore, the microlens may have an effective refractive index distribution that is substantially equal to that of a triangular prism. With this, it is possible to simultaneously receive the incident light having specific angles of incidence different from each other.

The above has described the solid-state imaging apparatus according to the present disclosure based on the embodiments. However, the present disclosure is not limited to these embodiments.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The present disclosure can be used for solid-state imaging apparatuses and particularly for cameras for viewing subjects stereoscopically, such as 3D cameras and 3D endoscopic cameras, and is commercially useful.

The invention claimed is:
1. A solid-state imaging apparatus comprising:
an imaging region; and
a plurality of unit cells arranged two-dimensionally in the imaging region, the plurality of unit cells including a first unit cell and a second unit cell directly adjacent to the first unit cell,
wherein each of the plurality of unit cells has a light-receiving element and a light-collecting element,
the first unit cell includes a first light-receiving element and a first light-collecting element, the first light-collecting element collects a first incident light to maximize an amount of a first light incident on the first light-receiving element when the first incident light is incident at a first angle-of-incidence,
the second unit cell directly adjacent to the first unit cell includes a second light-receiving element and a second light-collecting element, the second light-collecting element collects a second incident light to maximize an amount of a second light incident on the second light-receiving element when the second incident light is incident at a second angle-of-incidence,
an amount of the first light incident on the first light-receiving element when the first incident light is incident at a third angle-of-incidence on the first unit cell is equal to an amount of the second light incident on the second light-receiving element when the second incident light is incident at the third angle-of-incidence on the second unit cell,
the first angle-of-incidence is greater than the third angle-of-incidence by a predetermined amount, and
the second angle-of-incidence is smaller than the third angle-of-incidence by the predetermined amount.
2. The solid-state imaging apparatus according to claim 1, wherein the unit cells include a third unit cell adjacent to the first unit cell and a fourth unit cell adjacent to the second unit cell,
the third unit cell includes a third light-receiving element and a third light-collecting element,
the fourth unit cell includes a fourth light-receiving element and a fourth light-collecting element,
the third light-collecting element collects a third incident light to maximize an amount of a third light incident on the third light-receiving element when the third incident light is incident at the first angle-of-incidence,
the fourth light-collecting element collects a fourth incident light to maximize an amount of a fourth light incident on the fourth light-receiving element when the fourth incident light is incident at the second angle-of-incidence, an amount of the third light incident on the third light-receiving element when the third incident light is incident at the third angle-of-incidence on the third unit cell is equal to an amount of the second light incident on the second light-receiving element when the second incident light is incident at the third angle-of-incidence on the second unit cell, an amount of the fourth light incident on the fourth light-receiving element when the fourth incident light is incident at the third angle-of-incidence on the fourth unit cell is equal to an amount of the first light incident on the first light-receiving element when the first incident light is incident at the third angle-of-incidence on the first unit cell, and the imaging region is divided into a first region and a second region at a boundary between a plurality of the first unit cell and a plurality of the second unit cell, the first region being a first side of the imaging region in which a plurality of the third unit cell are arranged, the second region being a second side of the imaging region in which a plurality of the fourth unit cell are arranged.

3. The solid-state imaging apparatus according to claim 1, wherein a plurality of the first unit cell and a plurality of the second unit cell are disposed alternately in a column direction and a row direction.

4. The solid-state imaging apparatus according to claim 1, wherein a row including the first unit cell and a row including the second unit cell are disposed alternately in a column direction.

5. The solid-state imaging apparatus according to claim 4, wherein the first light-collecting element and the second light-collecting element are disposed as one unit.

6. The solid-state imaging apparatus according to claim 5, wherein each of the unit cells includes an inner-layer light-collecting element disposed below the light-collecting element.

7. The solid-state imaging apparatus according to claim 1, wherein a plurality of the first light-collecting element disposed in a same column and a plurality of the second light-collecting element disposed in a same column are disposed as one unit.

8. The solid-state imaging apparatus according to claim 7, wherein each of the unit cells includes an inner-layer light-collecting element disposed below the light-collecting element.

9. The solid-state imaging apparatus according to claim 1, wherein the light-collecting element is divided into line widths substantially a same as or shorter than a wavelength of incident light, and has an effective refractive index distribution controlled according to a combination of a plurality of light-transmissive films in a concentric structure about a center axis that is an axis which extends in a direction perpendicular to a light-receiving surface.

10. The solid-state imaging apparatus according to claim 1, wherein the light-collecting element has an effective refractive index distribution that is substantially equal to that of a triangular prism.

11. The solid-state imaging apparatus according to claim 1, wherein each of the unit cells includes an inner-layer light-collecting element disposed below the light-collecting element.

12. The solid-state imaging apparatus according to claim 11, wherein the inner-layer light-collecting element is divided into line widths substantially a same as or shorter than a wavelength of the incident light, and has an effective refractive index distribution controlled according to a combination of a plurality of light-transmissive films in a concentric structure about a center axis that is an axis which extends in a direction perpendicular to a light-receiving surface.

13. The solid-state imaging apparatus according to claim 12, wherein the concentric structure of the first unit cell is structurally different from the concentric structure of the second unit cell.

14. The solid-state imaging apparatus according to claim 1, wherein
the solid-state imaging apparatus is used for a camera comprising a single camera lens,
the single camera lens includes a first region and a second region different from the first region,
the first incident light is incident from the first region of the single camera lens, and
the second incident light is incident from the second region of the single camera lens.

15. The solid-state imaging apparatus according to claim 1, wherein
an amount of the first light incident on the second light-receiving element is substantially zero when the first incident light is incident at the first angle-of-incidence, and
an amount of the second light incident on the first light-receiving element is substantially zero when the second incident light is incident at the second angle-of-incidence.

16. The solid-state imaging apparatus according to claim 1, wherein the first light-collecting element and the second light-collecting element are disposed as one unit.

17. The solid-state imaging apparatus according to claim 1, wherein
the first light-collecting element and the second light-collecting element compose a single microlens.

18. The solid-state imaging apparatus according to claim 17, wherein
the single microlens is disposed across a column including the first unit cell and a column including the second unit cell.

19. A camera, comprising:
the solid-state imaging apparatus according to claim 1; and
a single camera lens, wherein
the single camera lens includes a first region and a second region different from the first region,
the first incident light is incident from the first region of the single camera lens, and
the second incident light is incident from the second region of the single camera lens.

* * * * *